United States Patent
More et al.

(10) Patent No.: US 11,264,478 B2
(45) Date of Patent: Mar. 1, 2022

(54) TRANSISTORS WITH REDUCED DEFECT AND METHODS FORMING SAME

(71) Applicant: Taiwan Semiconductor Manufacturing Company, Ltd., Hsinchu (TW)

(72) Inventors: Shahaji B. More, Hsinchu (TW); Chandrashekhar Prakash Savant, Hsinchu (TW); Tien-Wei Yu, Kaohsiung (TW); Chia-Ming Tsai, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/669,695

(22) Filed: Oct. 31, 2019

(65) Prior Publication Data
US 2021/0134974 A1  May 6, 2021

(51) Int. Cl.
| | | |
|---|---|---|
| *H01L 21/336* | (2006.01) | |
| *H01L 21/762* | (2006.01) | |
| *H01L 21/28* | (2006.01) | |
| *H01L 29/51* | (2006.01) | |
| *H01L 29/78* | (2006.01) | |
| *H01L 29/49* | (2006.01) | |
| *H01L 29/161* | (2006.01) | |

(Continued)

(52) U.S. Cl.
CPC ...... *H01L 29/513* (2013.01); *H01L 21/28088* (2013.01); *H01L 21/28185* (2013.01); *H01L 29/1054* (2013.01); *H01L 29/161* (2013.01); *H01L 29/4966* (2013.01); *H01L 29/517* (2013.01); *H01L 29/66795* (2013.01); *H01L 29/7851* (2013.01)

(58) Field of Classification Search
CPC . H01L 29/4908; H01L 29/517; H01L 29/513; H01L 21/28176; H01L 29/4966
See application file for complete search history.

(56) References Cited

U.S. PATENT DOCUMENTS

| | | | | |
|---|---|---|---|---|
| 8,071,458 B1 * | 12/2011 | Liu | ............... | H01L 21/28255 438/393 |
| 8,513,724 B2 | 8/2013 | Takeoka | | |
| 9,548,304 B2 | 1/2017 | Ji et al. | | |

(Continued)

FOREIGN PATENT DOCUMENTS

| | | |
|---|---|---|
| JP | 2010272782 A | 12/2010 |
| KR | 20120055577 A | 5/2012 |

(Continued)

OTHER PUBLICATIONS

Broqvist, et al., "Formation of substoichiometric GeOx at the Ge—HfO2 interface," Applied Physics Letters 97, 202908, Nov. 18, 2010, 4 pages.

*Primary Examiner* — Brian Turner
(74) *Attorney, Agent, or Firm* — Slater Matsil, LLP

(57) ABSTRACT

A device includes a semiconductor region, an interfacial layer over the semiconductor region, the interfacial layer including a semiconductor oxide, a high-k dielectric layer over the interfacial layer, and an intermixing layer over the high-k dielectric layer. The intermixing layer includes oxygen, a metal in the high-k dielectric layer, and an additional metal. A work-function layer is over the intermixing layer. A filling-metal region is over the work-function layer.

20 Claims, 33 Drawing Sheets

(51) Int. Cl.
*H01L 29/10* (2006.01)
*H01L 29/66* (2006.01)

(56) References Cited

U.S. PATENT DOCUMENTS

| | | | |
|---|---|---|---|
| 10,686,059 | B2 | 6/2020 | Chang et al. |
| 10,930,495 | B2 | 2/2021 | Cheng et al. |
| 10,964,542 | B2 | 3/2021 | Okuno et al. |
| 11,075,124 | B2 | 7/2021 | Lee et al. |
| 2010/0197128 | A1* | 8/2010 | Schaeffer ........ H01L 21/823807 438/591 |
| 2011/0049642 | A1 | 3/2011 | Scheiper et al. |
| 2011/0127616 | A1* | 6/2011 | Hoentschel ....... H01L 21/28176 257/392 |
| 2012/0021596 | A1* | 1/2012 | Han .................... H01L 29/4908 438/591 |
| 2015/0035073 | A1 | 2/2015 | Ando et al. |
| 2015/0132937 | A1 | 5/2015 | Kim et al. |
| 2019/0019874 | A1* | 1/2019 | Ma .................... H01L 21/28568 |
| 2019/0157135 | A1 | 5/2019 | Ku et al. |
| 2019/0312143 | A1 | 10/2019 | Lin et al. |
| 2020/0098640 | A1 | 3/2020 | Savant et al. |
| 2020/0105894 | A1 | 4/2020 | Wang et al. |

FOREIGN PATENT DOCUMENTS

| | | |
|---|---|---|
| KR | 20150054422 A | 5/2015 |
| KR | 20150055219 A | 5/2015 |
| KR | 20150065145 A | 6/2015 |
| KR | 20190058329 A | 5/2019 |
| TW | 201642326 A | 12/2016 |
| TW | 201642465 A | 12/2016 |
| TW | 201919113 A | 5/2019 |
| TW | 201923897 A | 6/2019 |

* cited by examiner

| N-metal | | | |
|---|---|---|---|
| 2nd TiN (PMG) | | | — 142B |
| 1st TiN (PMG) | N-metal | | — 142A(128) |
| Mx-Ti-Hf-Ox | 2nd TiN (PMG) | N-metal | — 134 |
| HK | Mx-Ti-Hf-Ox | Mx-Ti-Hf-Ox | — 66 |
| IL (Thin SiO) | HK | HK | — 64A |
| Si | IL (Thin SiO) | IL (Thin SiO) | — 36A |
| | Si | Si | |

FIG. 32

TRANSISTORS WITH REDUCED DEFECT AND METHODS FORMING SAME

BACKGROUND

Metal-Oxide-Semiconductor (MOS) devices are basic building elements in integrated circuits. A MOS device may have a gate electrode formed of polysilicon doped with p-type or n-type impurities, which are doped using doping processes such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to meet the requirements of the NMOS devices and PMOS devices.

The formation of metal gates typically involves depositing metal layers and then performing Chemical Mechanical Polish (CMP) processes to remove excess portions of the metal layers. The remaining portions of the metal layers form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 31 and 32 illustrate the comparison of gate stacks of p-type and n-type transistors, respectively in accordance with some embodiments.

DETAILED DESCRIPTION

Figure 1:
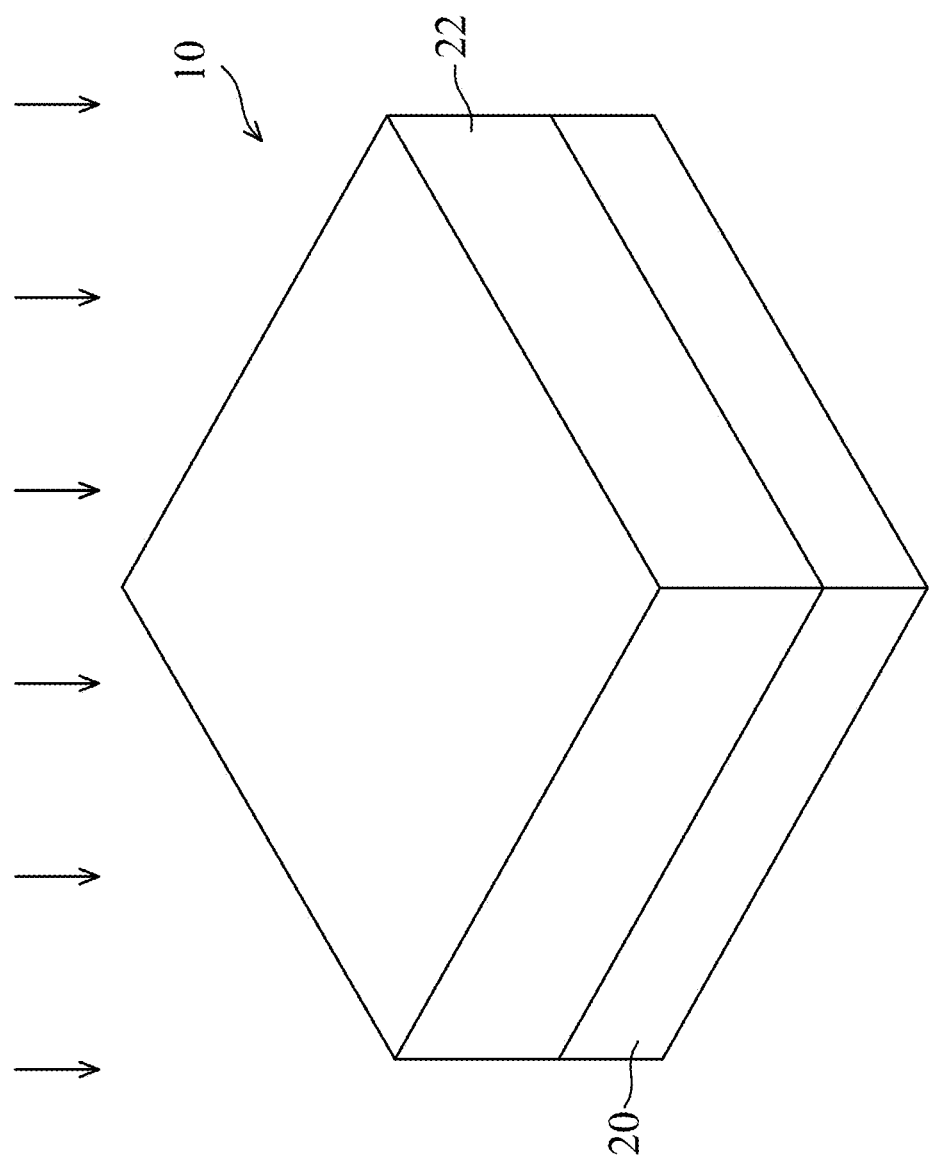
FIGS. 1-6, 7A, 7B, 8A, 8B, 9, 10A, 10B, 11-18, 23 and 24 illustrate the perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with replacement gates and the methods of forming the same are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements. In the illustrated example embodiments, the formation of Fin Field-Effect Transistors (FinFETs) is used as an example to explain the concept of the present disclosure. Other types of transistors such as planar transistors and Gate-All-Around (GAA) transistors may also adopt the concept of the present disclosure. In accordance with some embodiments of the present disclosure, a silicon germanium fin is formed. An interfacial layer (IL), which includes silicon oxide and germanium oxide, is formed on the silicon germanium fin, followed by the deposition of a high-k dielectric layer. A metal layer is formed over the high-k dielectric layer. An anneal process is performed. The anneal process results in the oxygen atoms in the IL to diffuse into, and bond with, the metal in the metal layer. The germanium atoms in the IL, on the other hand, diffuse down into the silicon germanium fin. Accordingly, the IL becomes silicon-rich due to the removal of the germanium oxide. The IL also becomes thinner, and the Effective Oxide Thickness (EOT) of the gate dielectric is reduced. The underlying germanium-containing fin becomes germanium rich, which results in the increase in the channel mobility.

Figure 33:
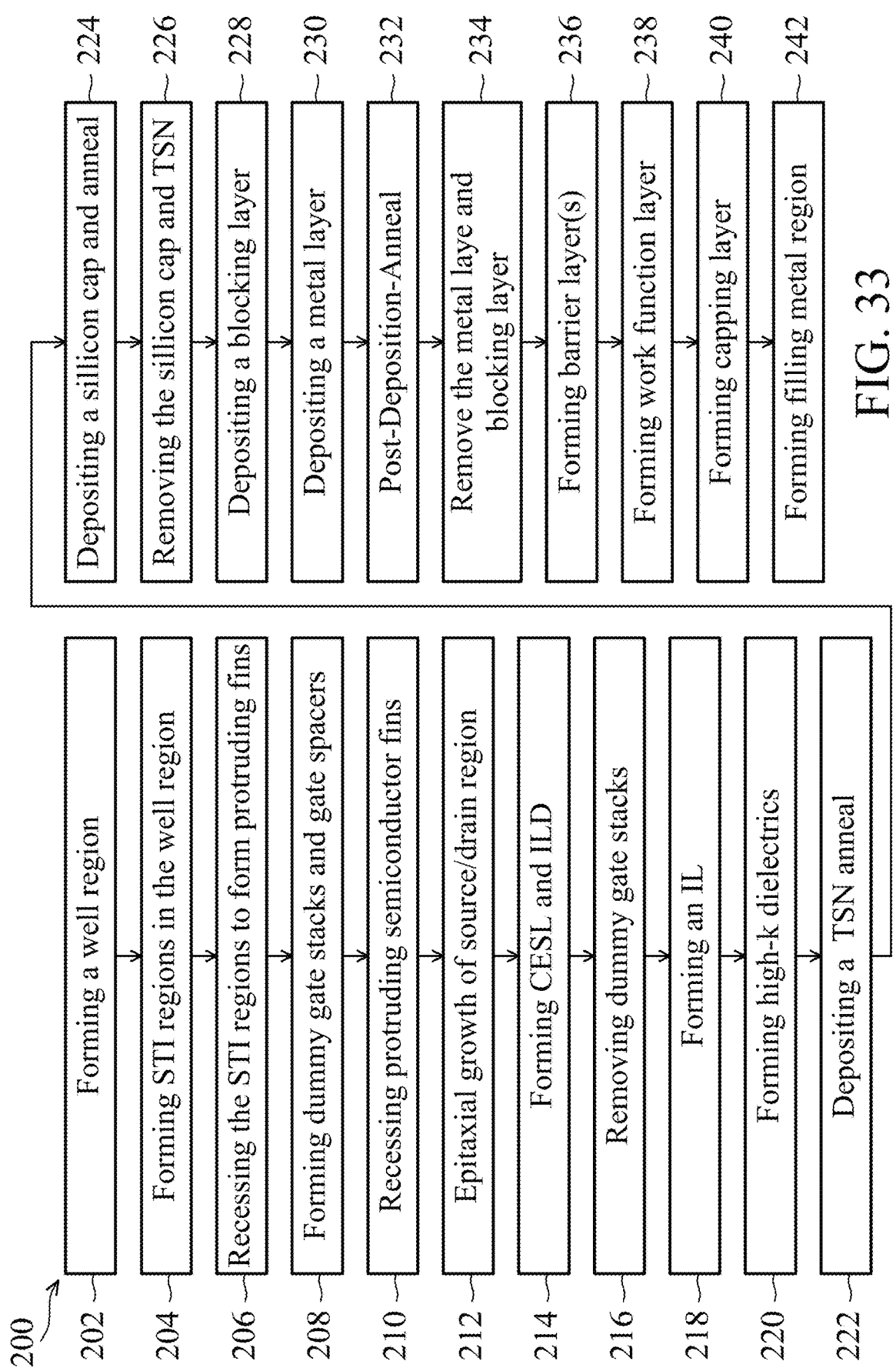
FIG. 33 illustrates a process flow for forming a gate stack in accordance with some embodiments.

FIGS. 1-6, 7A, 7B, 8A, 8B, 9, 10A, 10B, 11-18, 23 and 24 illustrate the cross-sectional views and perspective views of intermediate stages in the formation of a Fin Field-Effect Transistor (FinFET) in accordance with some embodiments of the present disclosure. The processes shown in these figures are also reflected schematically in the process flow 200 shown in FIG. 33.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 33. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
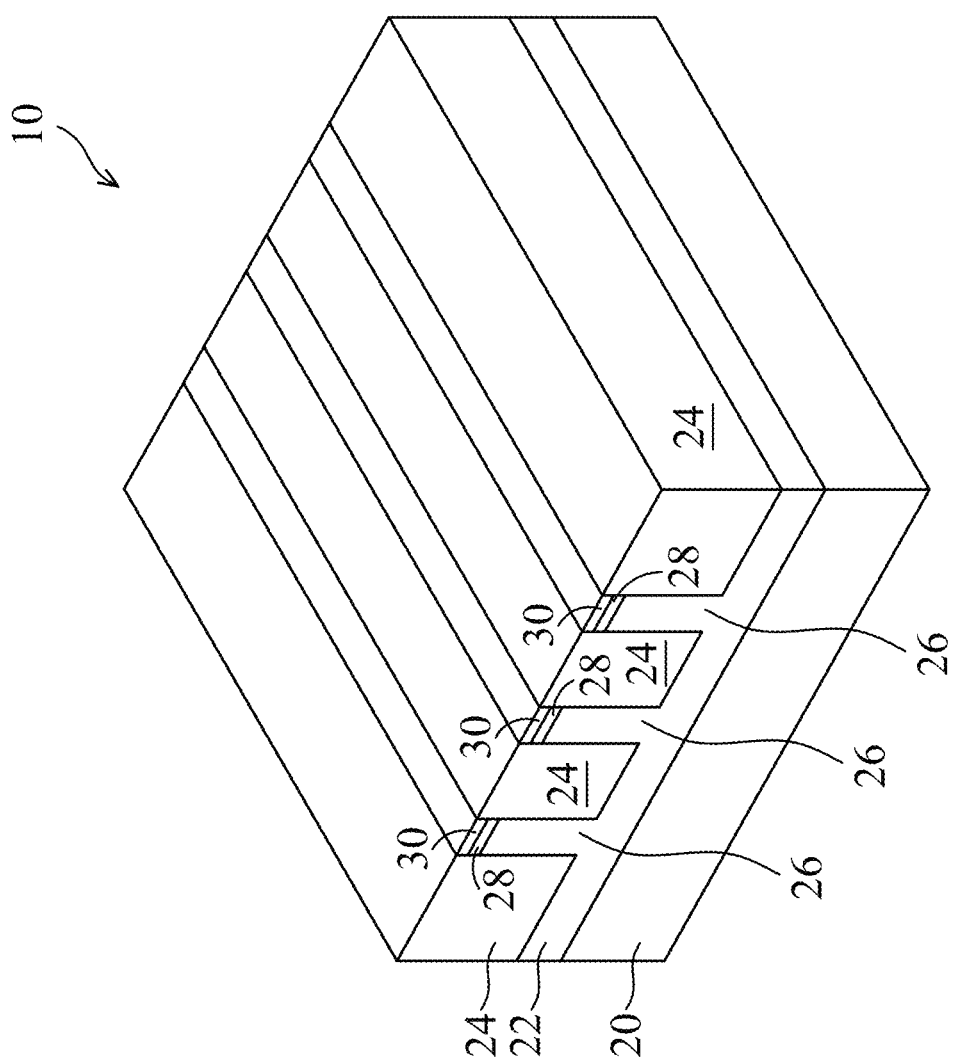

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 shown in FIG. 33. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner dielectric, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from the material of substrate 20. In accordance with some embodiments, semiconductor strips 26 are formed of a germanium-containing material such as silicon germanium. The germanium atomic percentage in protruding fins 36 may be in the range between about 30 percent and about 70 percent in accordance with some embodiments.

Figure 3:
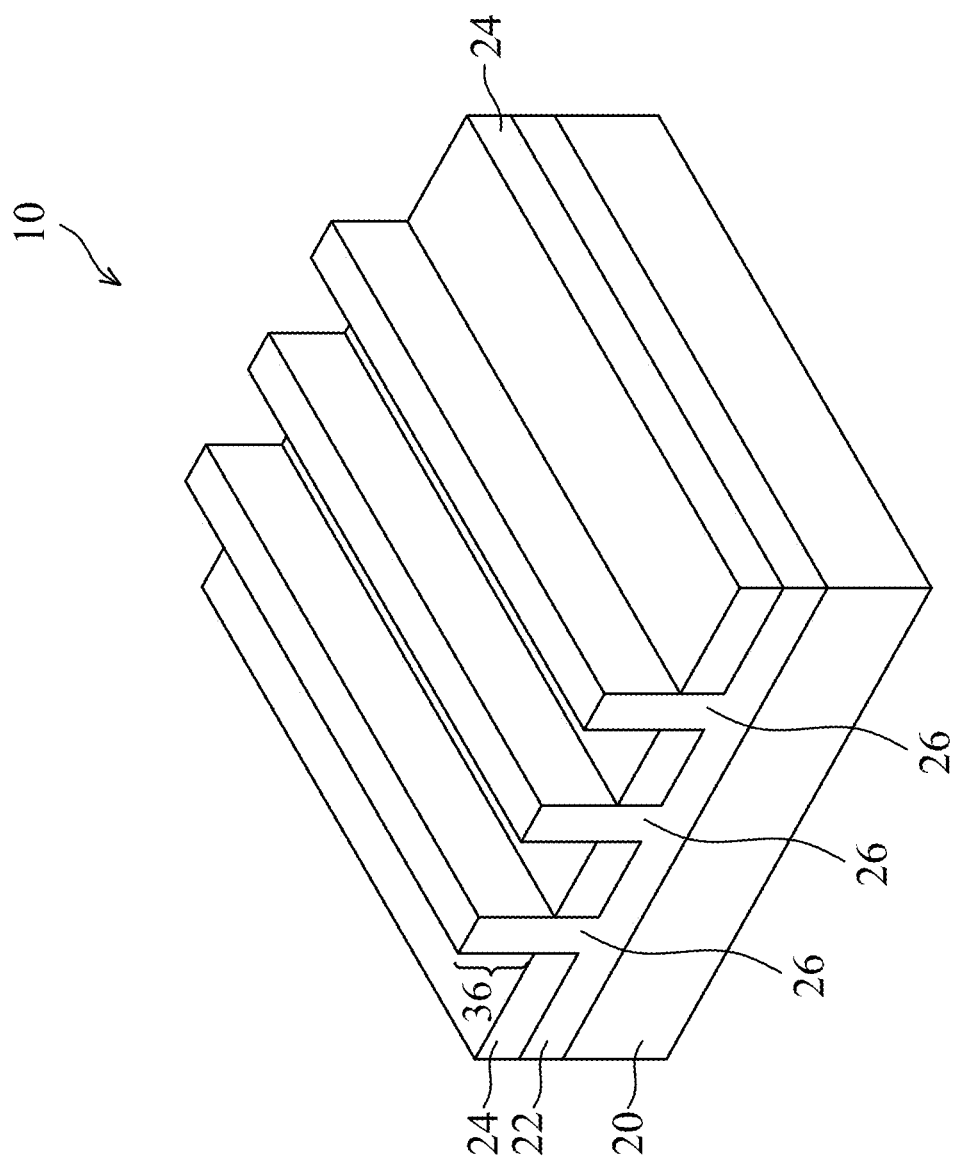

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 206 in the process flow 200 shown in FIG. 33. The etching may be performed using a dry etching process, wherein $HF_3$ and $NH_3$, for example, are used as the etching gases. During the etching process, plasma may be generated. Argon may also be included. In accordance with alternative embodiments of the present disclosure, the recessing of STI regions 24 is performed using a wet etching process. The etching chemical may include HF, for example.

In accordance with some embodiments of the present disclosure, protruding fins 36 are formed of the germanium-containing material such as silicon germanium. In accordance with alternative embodiments, protruding fins 36 comprises silicon and is free from germanium. The semiconductor fins including germanium and the semiconductor fins free from germanium may be formed in a same wafer. For example, referring to FIG. 8B, in wafer 10, there may be an n-type FinFET region 21N and a p-type FinFET region 21P, in which an n-type FinFET and a p-type FinFET, respectively, are to be formed. The protruding fins 36A may be a silicon-containing fin (free from germanium), and the protruding fins 36B may be a silicon germanium fin. In the following discussion, unless specified otherwise, the protruding fins refer to the protruding fins 36B, which may be formed of silicon germanium.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
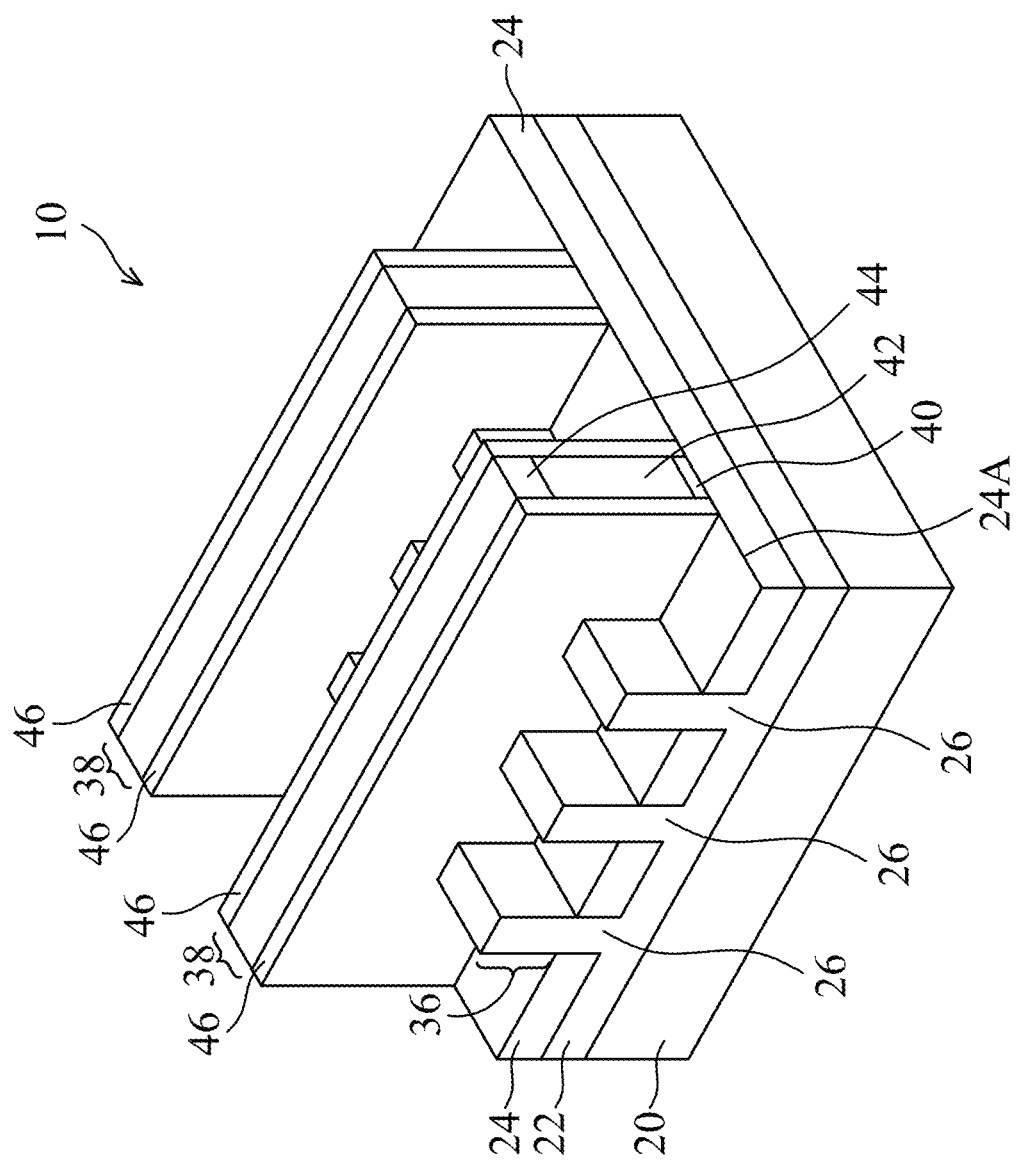

Referring to FIG. 4, dummy gate stacks 38 are formed to extend on the top surfaces and the sidewalls of (protruding) fins 36. The respective process is illustrated as process 208 in the process flow 200 shown in FIG. 33. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 shown in FIG. 33. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
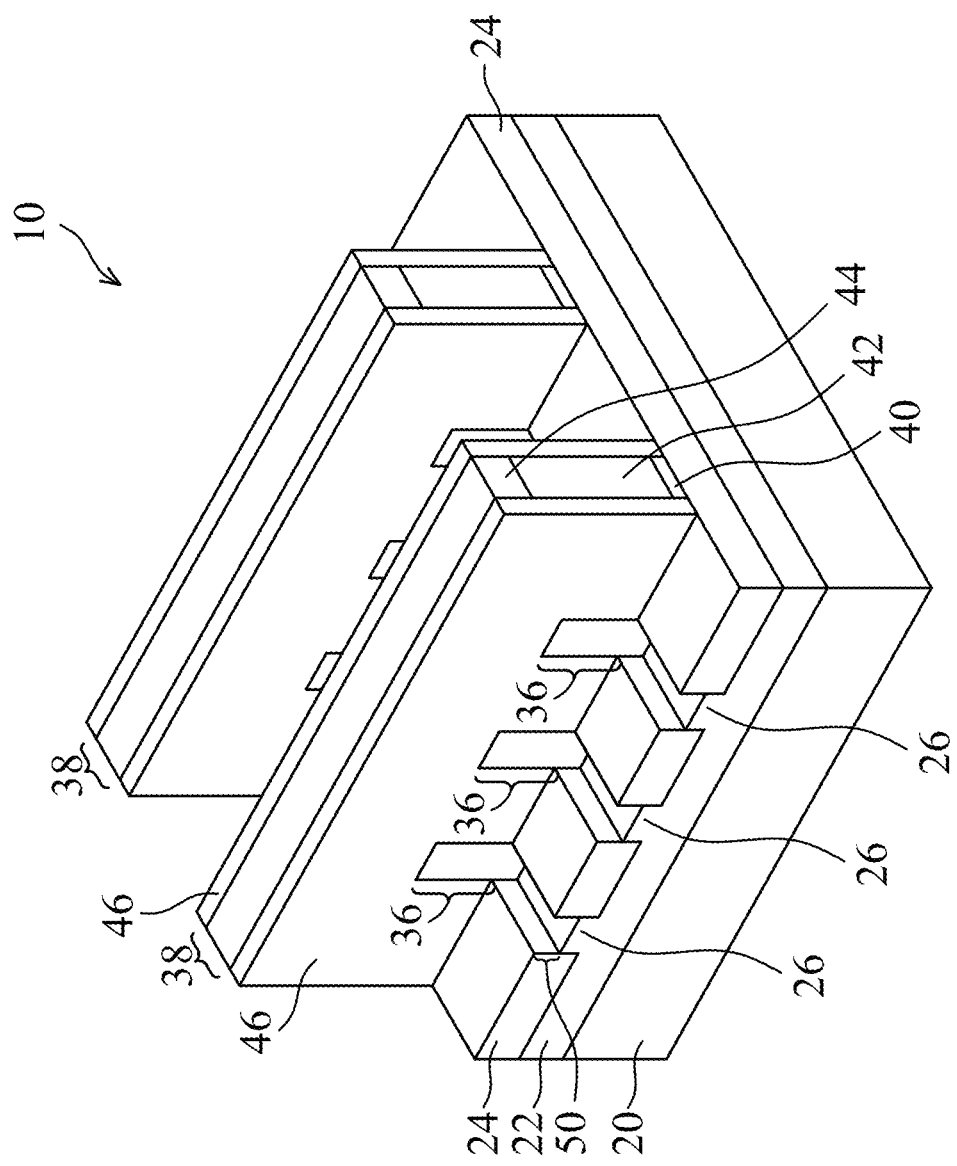

An etching process is then performed to etch the portions of protruding fins 36 that are not covered by dummy gate stacks 38 and gate spacers 46, resulting in the structure shown in FIG. 5. The respective process is illustrated as process 210 in the process flow 200 shown in FIG. 33. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
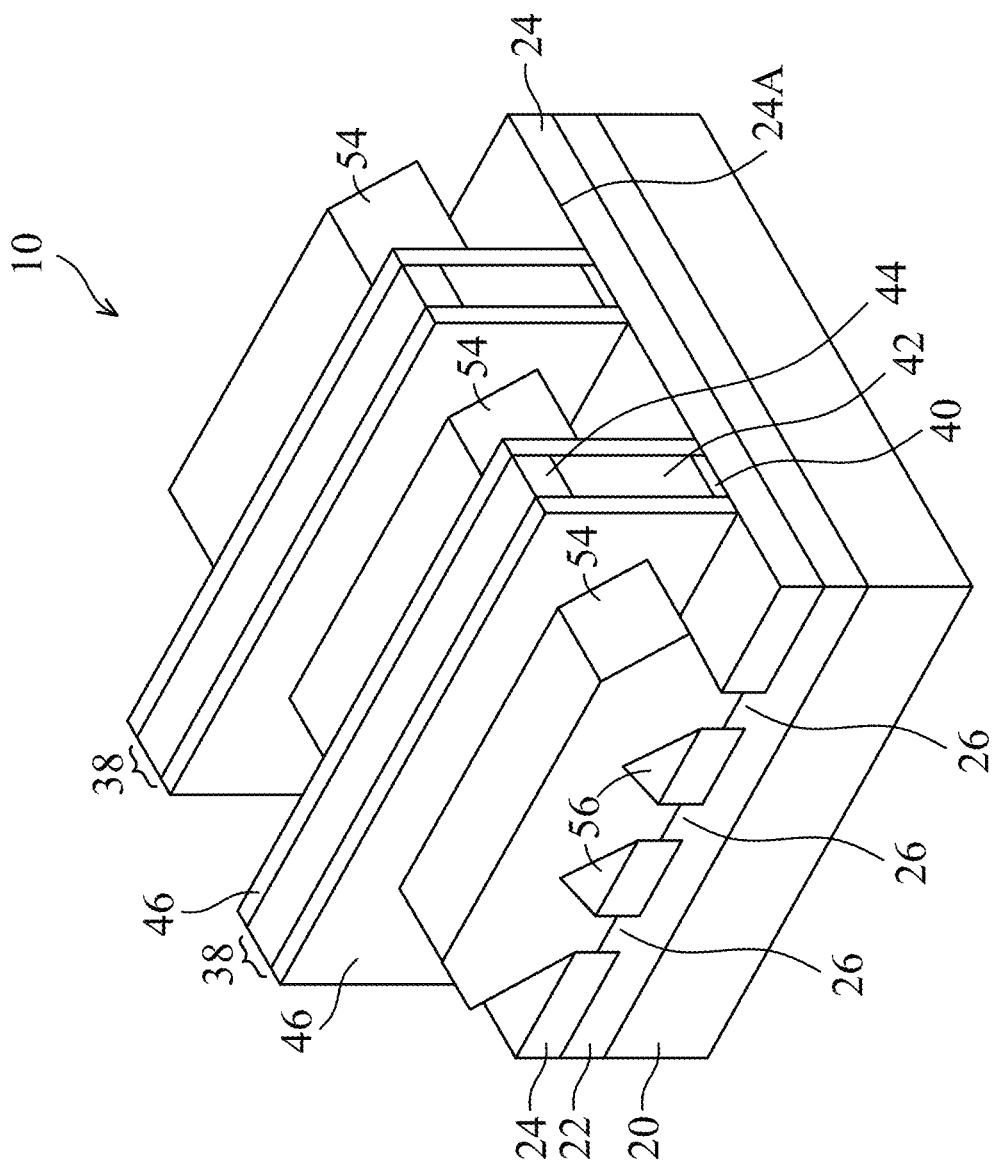

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 shown in FIG. 33. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated.

Figure 7A:
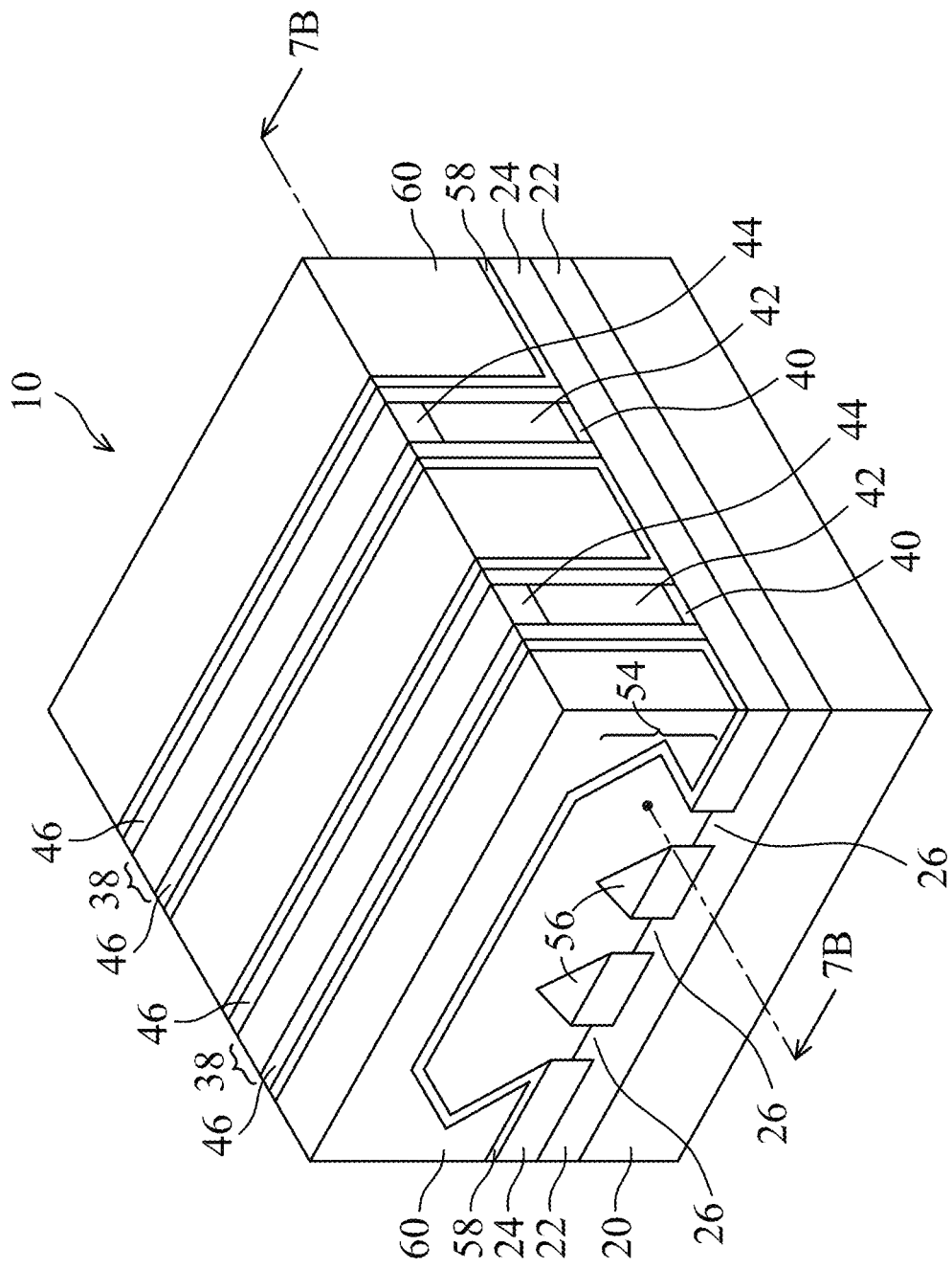

FIG. 7A illustrates a perspective view of the structure after the formation of Contact Etch Stop Layer (CESL) 58 and Inter-Layer Dielectric (ILD) 60. The respective process is illustrated as process 214 in the process flow 200 shown in FIG. 33. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
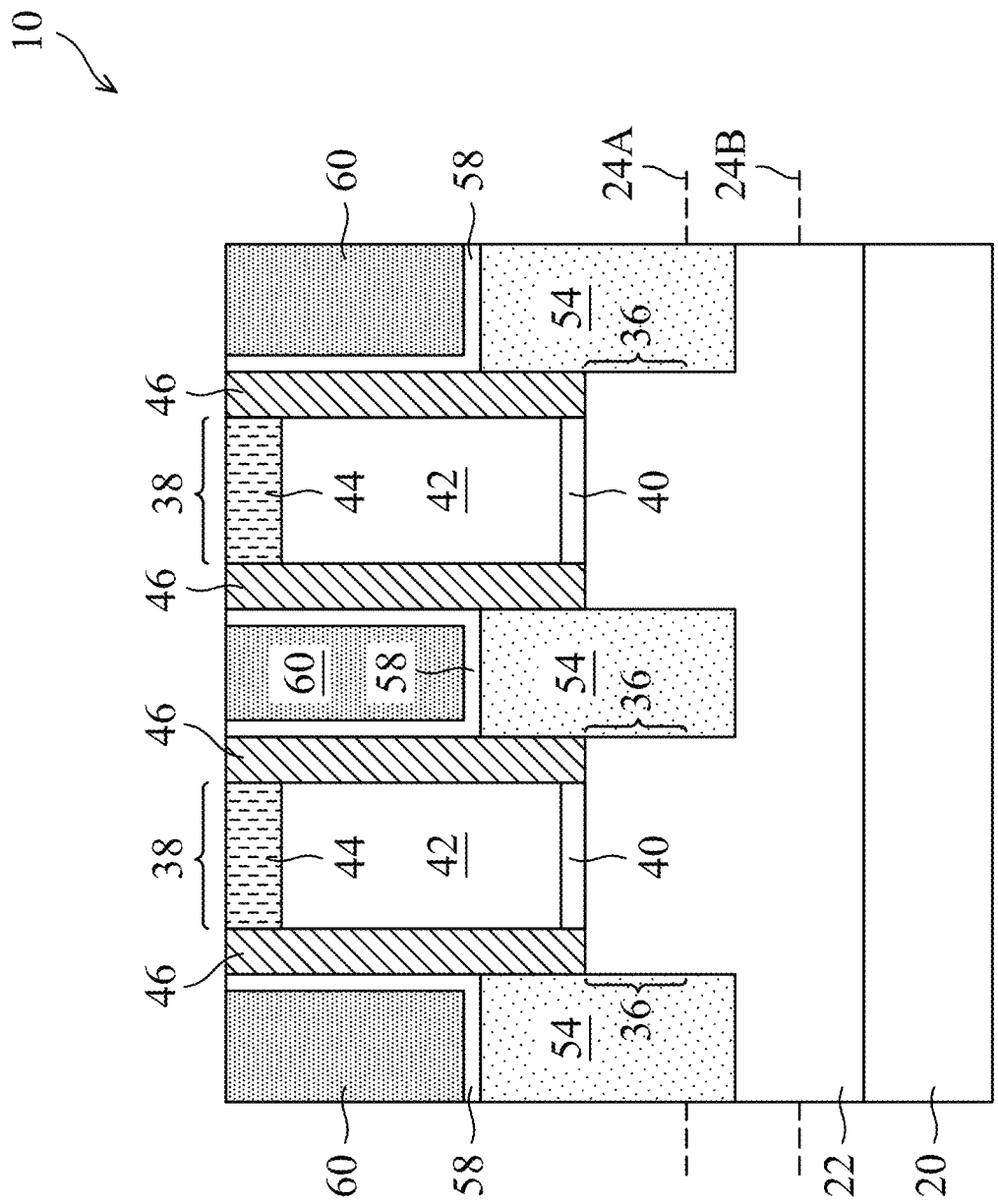
Figure 8A:
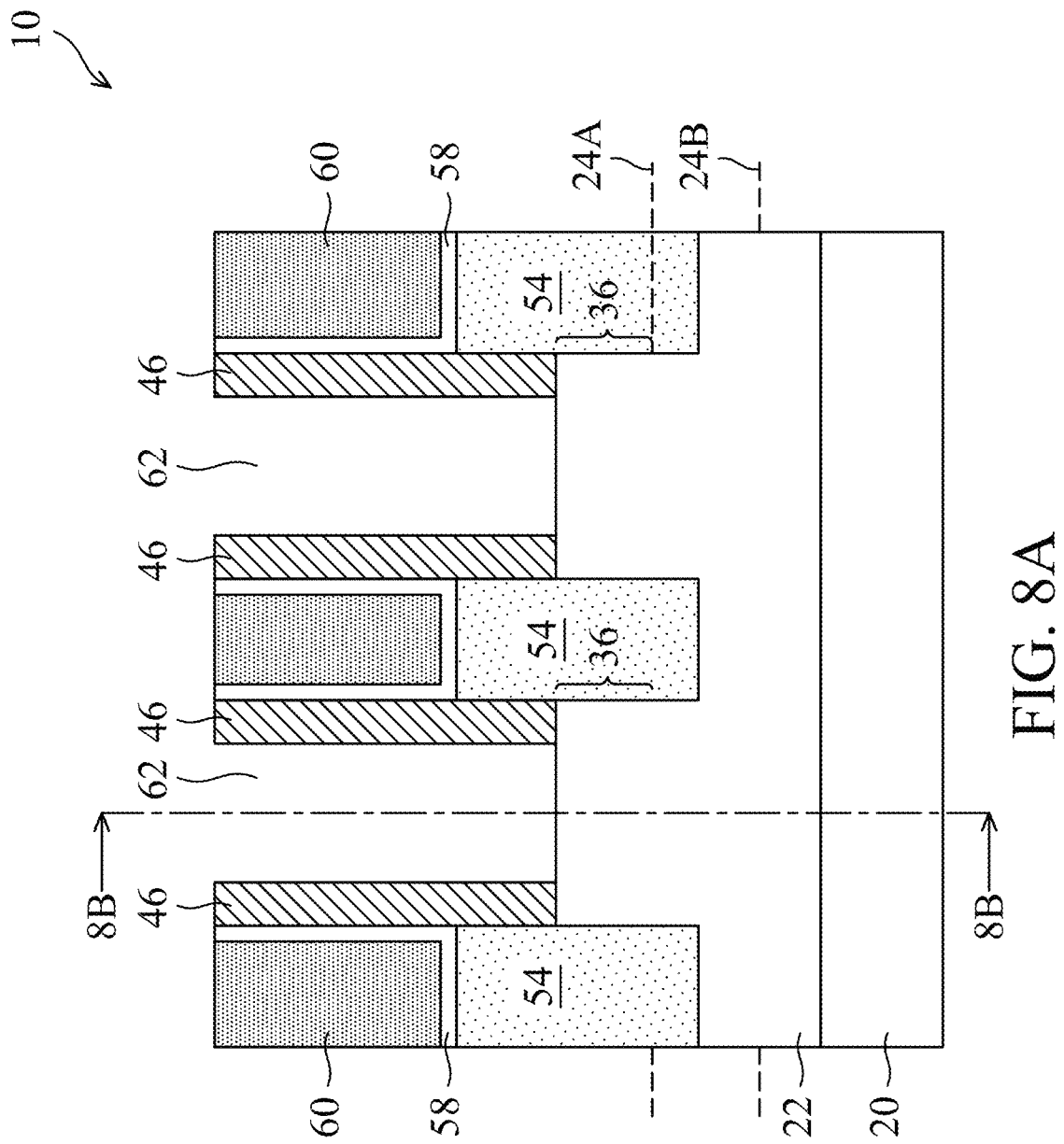
Figure 8B:
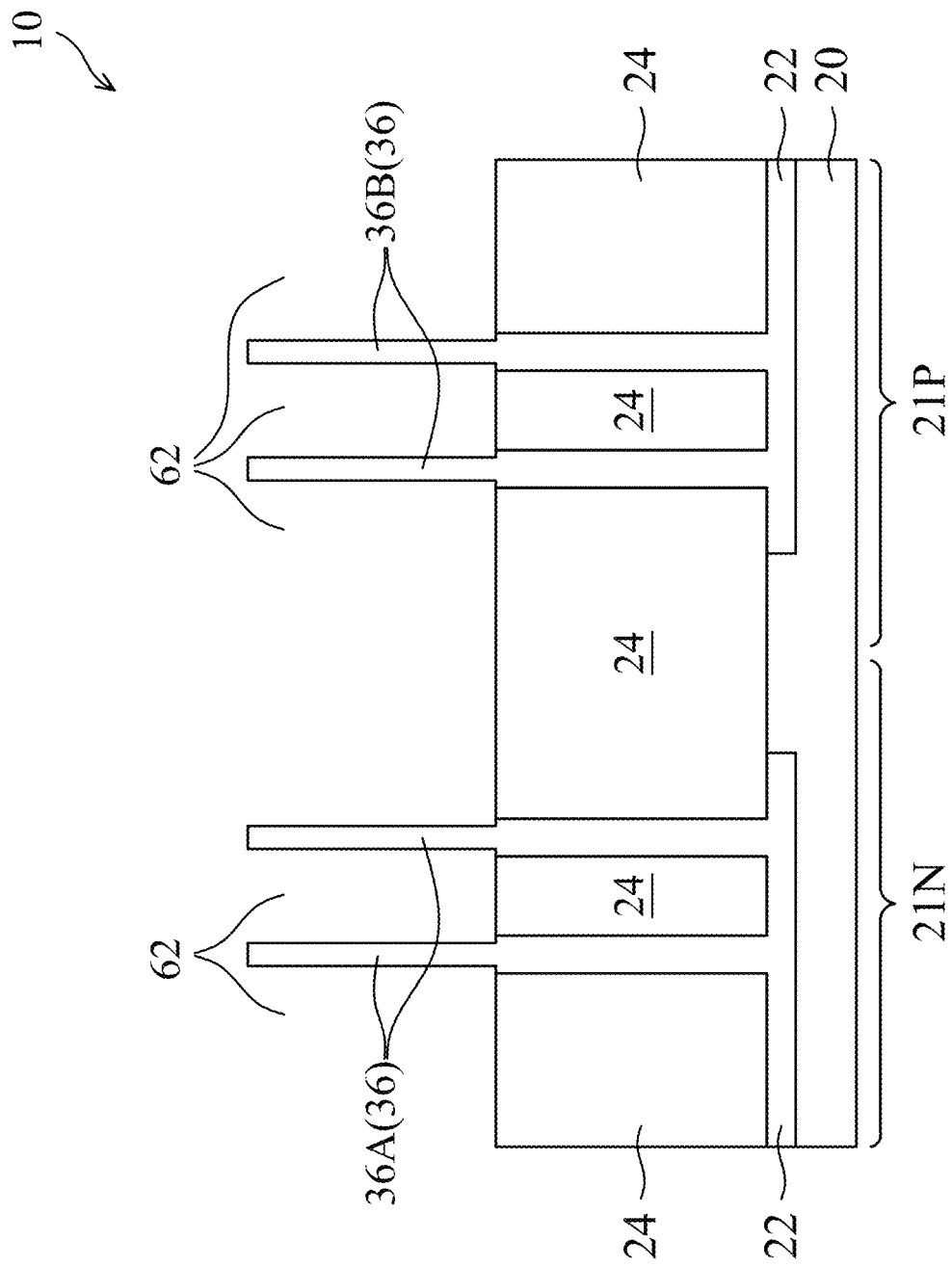

FIG. 7B illustrates the reference cross-section 7B-7B in FIG. 7A, in which dummy gate stacks 38 are illustrated. Next, the dummy gate stacks 38 including hard mask layers 44, dummy gate electrodes 42 and dummy gate dielectrics 40 are removed in an etching process(es), forming trenches 62 between gate spacers 46, as shown in FIG. 8A. The respective process is illustrated as process 216 in the process flow 200 shown in FIG. 33. The top surfaces and the sidewalls of protruding fins 36 are exposed to trenches 62, as shown in FIG. 8B. FIG. 8B illustrates a cross-sectional view obtained from the reference cross-section 8B-8B in FIG. 8A, with both of an N-type transistor region 21N and a p-type transistor region 21P illustrated. Furthermore, as aforementioned, the protruding fins 36 may include silicon-containing fins 36A (which may be free from germanium) in n-type FinFET region 21N, and germanium-containing fins 36B (which may comprise silicon germanium) in p-type FinFET region 21P. In FIG. 7B and some subsequent figures, the levels of the top surfaces 24A and bottom surfaces 24B of STI regions 24 are illustrated.

Figure 9:
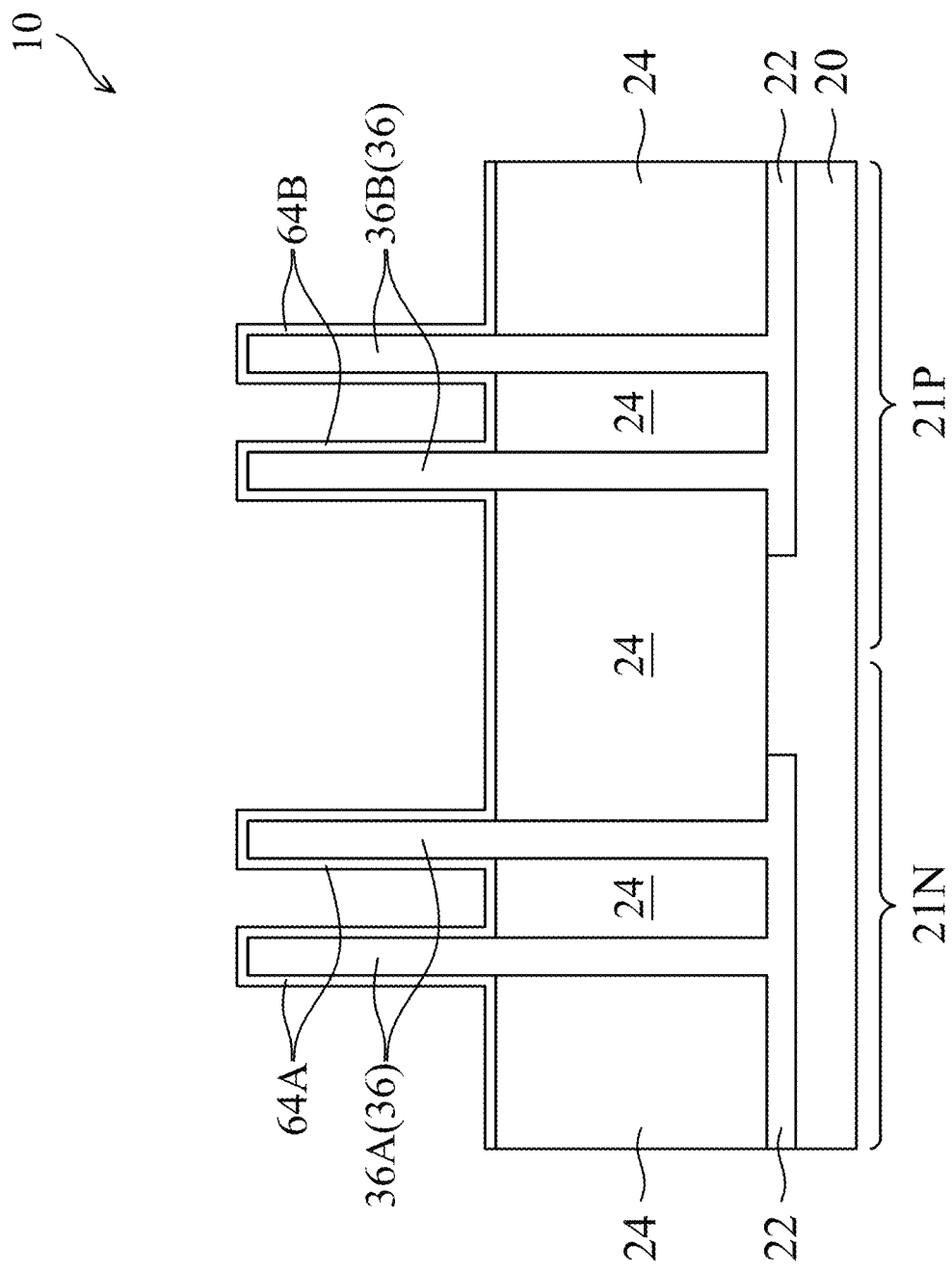

FIG. 9 illustrates the formation of ILs 64A and 64B on protruding fins 36A and 36B, respectively, through an oxidation process. The respective process is illustrated as process 218 in the process flow 200 shown in FIG. 33. In accordance with some embodiments, the oxidation process includes a chemical oxidation process, which is performed by contacting wafer 10 in a chemical solution comprising the mixture of one or more of ozonated ($O_3$)) De-Ionized) (DI) water, hydrogen peroxide ($H_2O_2$) sulfuric acid ($H_2SO_4$), ammonium hydroxide ($NH_4OH$), and the like, or combinations thereof. The oxidation process may be performed at a temperature ranging from room temperature (for example, about 21° C.) to about 80° C. In accordance with alternative embodiments, the oxidation process includes a thermal oxidation process, in which wafer 10 is annealed in an oxygen-comprising environment including oxygen ($O_2$), ozone ($O_3$), or the like. IL 64A may include silicon oxide ($SiO_2$), and may be free from germanium oxide. IL 64B may include silicon oxide and germanium oxide (which are also referred to as silicon germanium oxide).

Figure 10A:
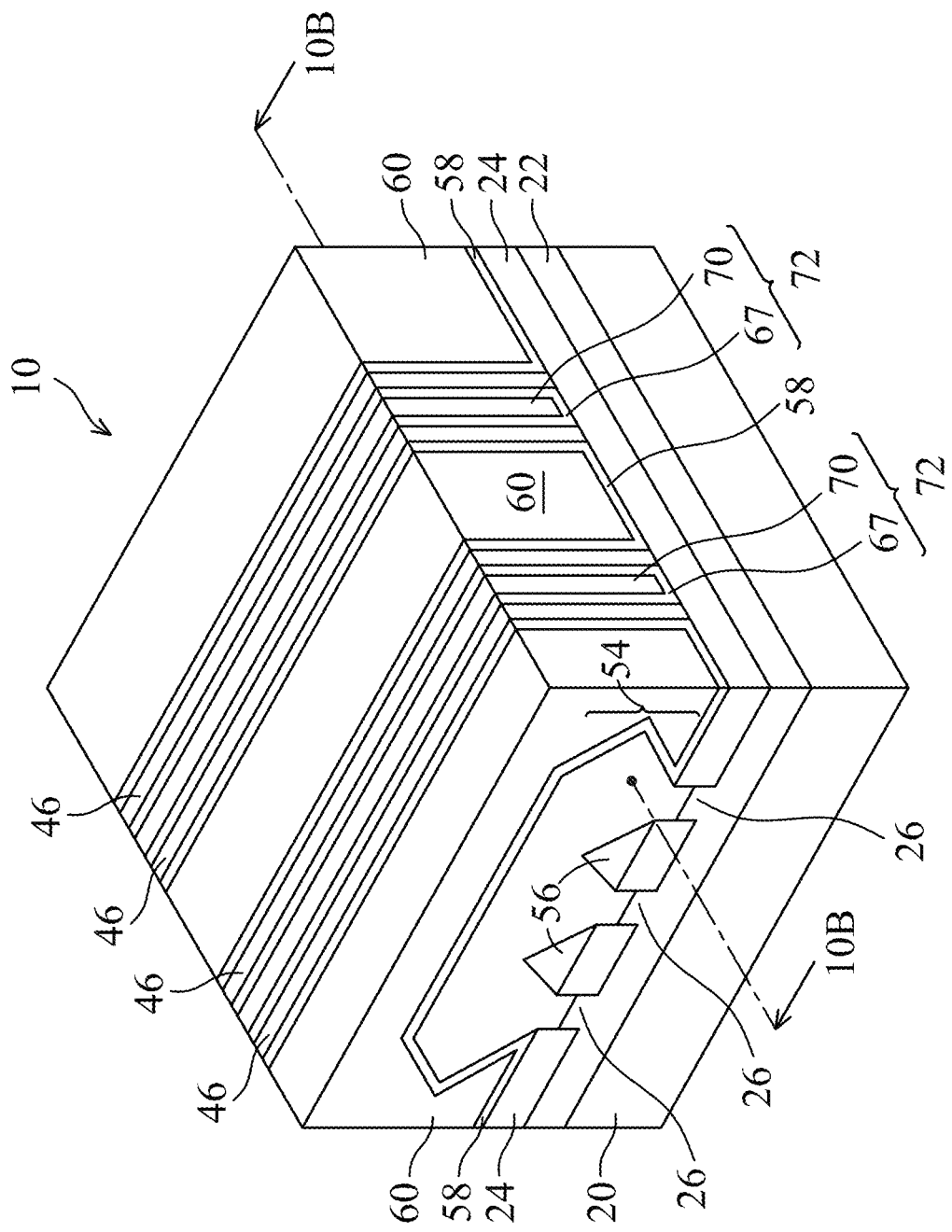
Figure 10B:
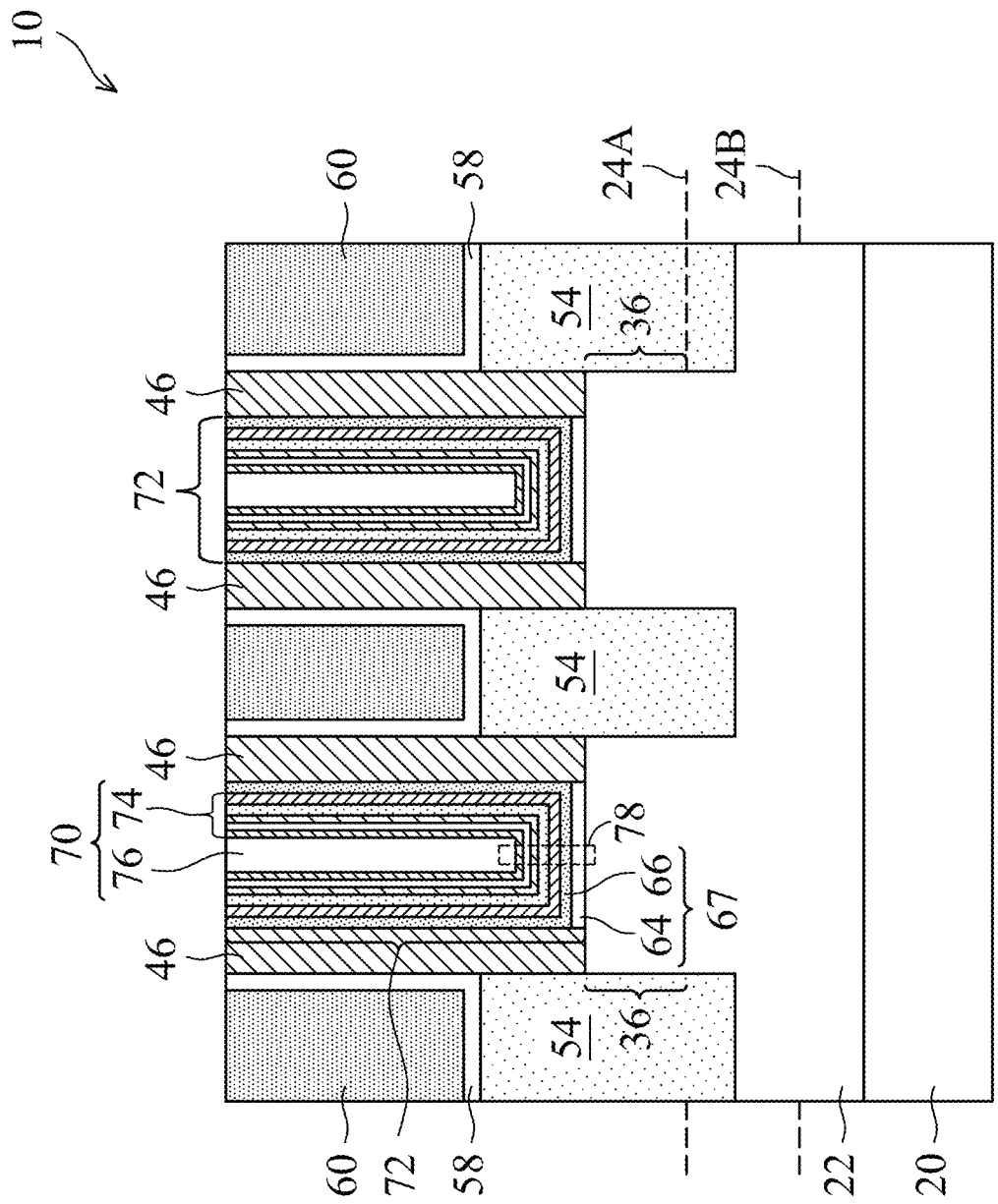

Next, as shown in FIGS. 10A and 10B, additional components are formed to result in replacement gate stacks 72 filling in trenches 62 (FIG. 8A). FIG. 10B illustrates the reference cross-section 10B-10B in FIG. 10A. Replacement gate stacks 72 include gate dielectrics 67 and the corresponding gate electrodes 70.

As shown in FIG. 10B, gate dielectric 67 includes IL 64 and high-k dielectric layer 66 formed over IL 64. The formation process of high-k dielectric layer 66 is illustrated as process 220 in the process flow 200 shown in FIG. 33. High-k dielectric layer 66 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layer 66 is formed as a conformal layer, and extends on the sidewalls of protruding fins 36 and the top surfaces and the sidewalls of gate spacers 46. In accordance with some embodiments of the present disclosure, high-k dielectric layer 66 is formed using ALD, CVD, PECVD, Molecular-Beam Deposition (MBD), or the like.

Further referring to FIGS. 10A and 10B, gate electrode 70 is formed on gate dielectric 67. Gate electrode 70 may include a plurality of metal-containing layers 74, which may be formed as conformal layers, and a filling-metal region 76 filling the rest of the trench unfilled by the plurality of metal-containing layers 74. Metal-containing layers 74 may include a barrier layer, one or a plurality work-function layers over the barrier layer, and one or a plurality of metal capping layers over the work-function layer. The detailed structure of the metal-containing layers 74 is discussed referring to FIGS. 11 through 18, which shows the gate structure for a p-type FinFET in accordance with some embodiments.

FIG. 10B schematically illustrates region 78, in which a portion of fin 36, a portion of IL 64B, a portion of high-k dielectric layer 66, a portion of metal-containing layers 74, and a portion of filling-metal region 76 are included. FIGS. 11 through 18 illustrate the formation of the features that extend into region 78 in accordance with some embodiments. It is appreciated that the high-k dielectric layer 66, and metal-containing layers 74, and filling-metal region 76 may include horizontal portions on the top of ILD 60 and gate spacers 46, which horizontal portions are removed in a planarization process to result in the structure shown in FIG. 10B.

Figure 11:
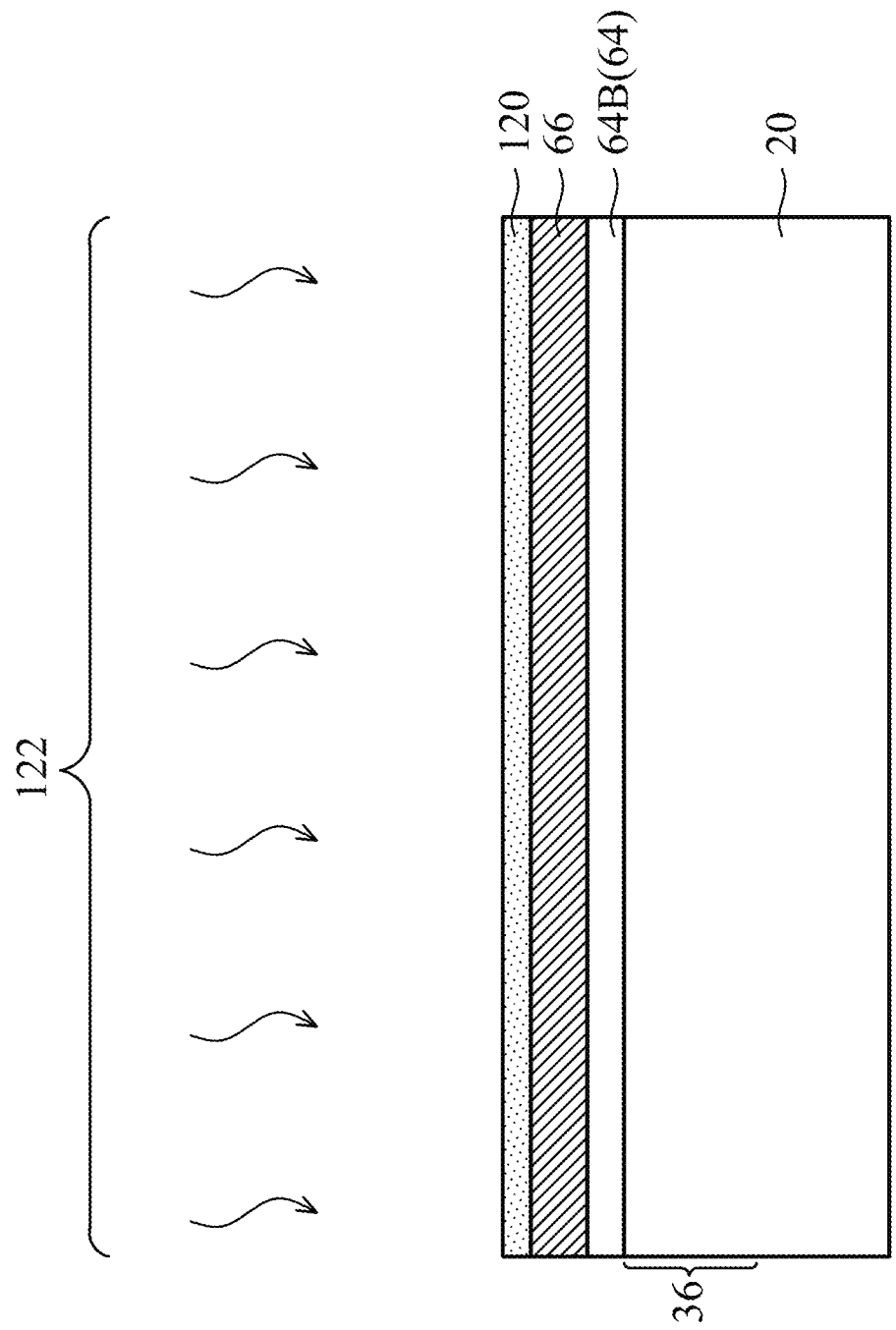

Referring to FIG. 11, IL 64B (also refer to FIG. 9) is on protruding fin 36. High-k dielectric layer 66 is over and contacting IL 64B. In accordance some embodiments, Titanium Silicon Nitride (TSN) 120 is formed over high-k dielectric layer 66. The respective process is illustrated as process 222 in the process flow 200 shown in FIG. 33. TSN layer 120 may be formed using ALD or CVD, and the TSN layer 120 may include alternatingly deposited TiN layers and SiN layers. Since the TiN layers and SiN layers are very thin, these layers may not be able to be distinguished from each other, and hence in combination form a TSN layer.

A Post-Metallization Anneal (PMA) process 122 is performed. The respective process is also illustrated as process 222 in the process flow 200 shown in FIG. 33. The PMA process 122 may be performed using furnace anneal, flash anneal, or the like. The temperature of PMA process 122 may be in a range between about 600° C. and about 900° C. The annealing duration may be in the range between about 2 seconds and about 120 seconds. The PMA process 122 may be performed with a process gas comprising $NH_3$, $N_2$, $H_2$, $O_2$, and/or the like.

Figure 12:
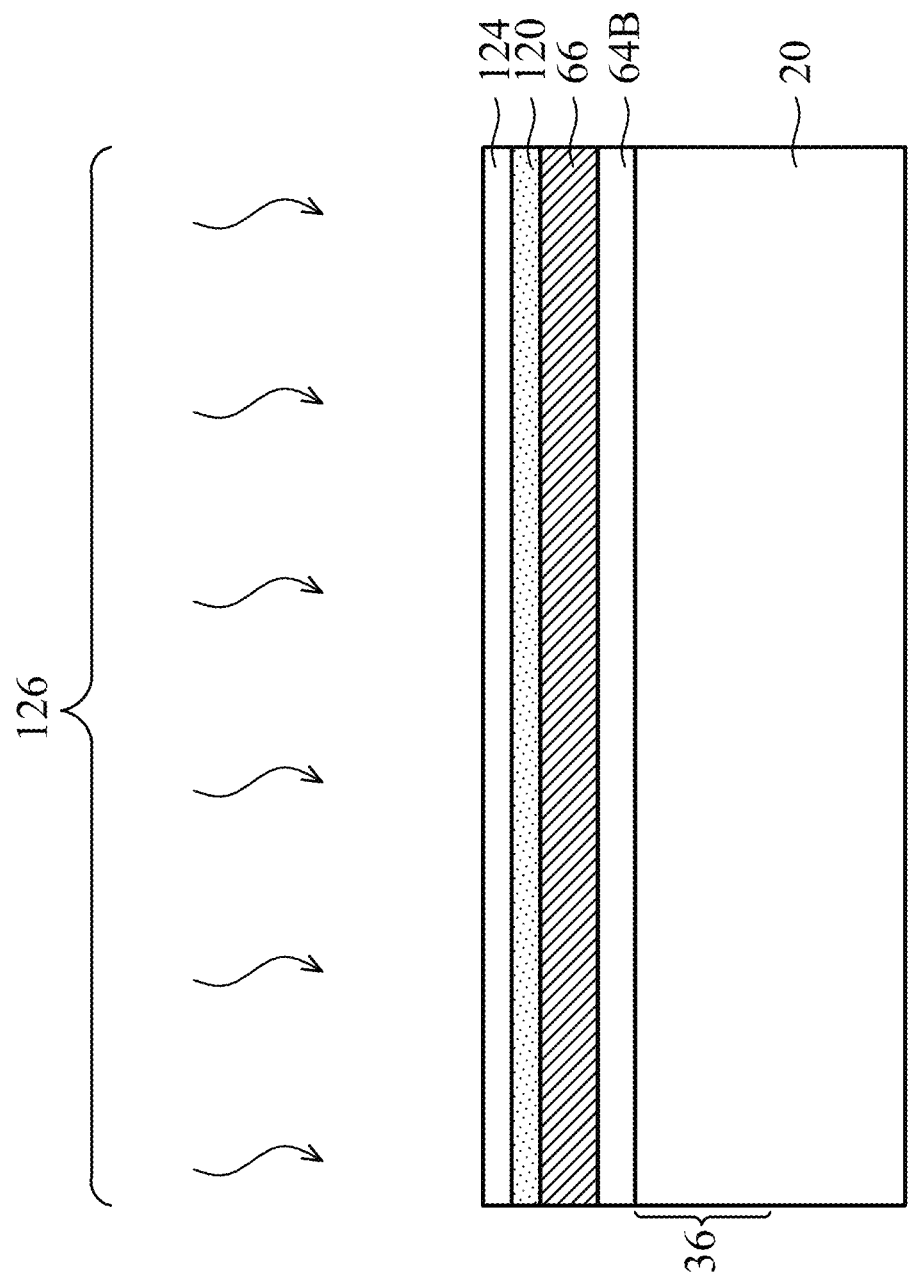

FIG. 12 illustrates the deposition of silicon capping layer 124. The respective process is illustrated as process 224 in the process flow 200 shown in FIG. 33. In accordance with some embodiments, silicon capping layer 124 is deposited using a silicon-containing precursor comprising silane, disilane, dichlorosilane (DCS), or the like. After the deposition, a Post-Capping Annealing (PCA) process 126 is performed. The respective process is also illustrated as process 224 in the process flow 200 shown in FIG. 33. The PCA process may be performed using furnace anneal, flash anneal, or the like. The temperature of PCA process 126 may be in a range between about 650° C. and about 1,100° C. The annealing duration may be in the range between about 2 seconds and about 120 seconds. The PCA process 126 may be performed with a process gas comprising $NH_3$, $N_2$, $H_2$, $O_2$, and/or the like.

Figure 13:
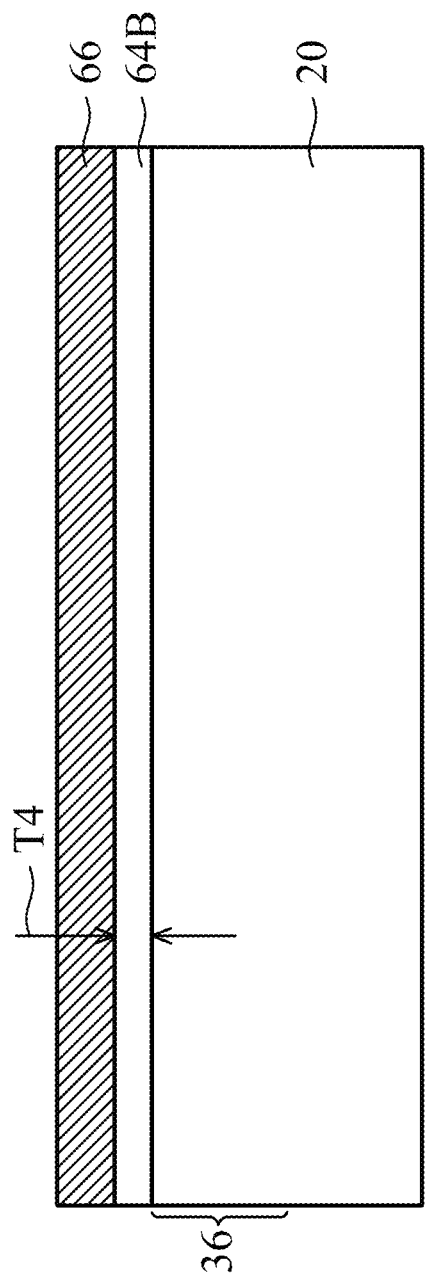

Next, TSN layer 120 and silicon capping layer 124 are removed in an etching process(es). The respective process is illustrated as process 226 in the process flow 200 shown in FIG. 33. The resulting structure is shown in FIG. 13. The deposition, annealing, and the subsequent removal of TSN layer 120 and silicon capping layer 124 may improve the reliability of high-k dielectric layer 66 and its thermal stability. In accordance with alternative embodiments of the present disclosure, the deposition, annealing, and the subsequent removal of TSN layer 120 and silicon capping layer 124 are skipped.

Figure 14:
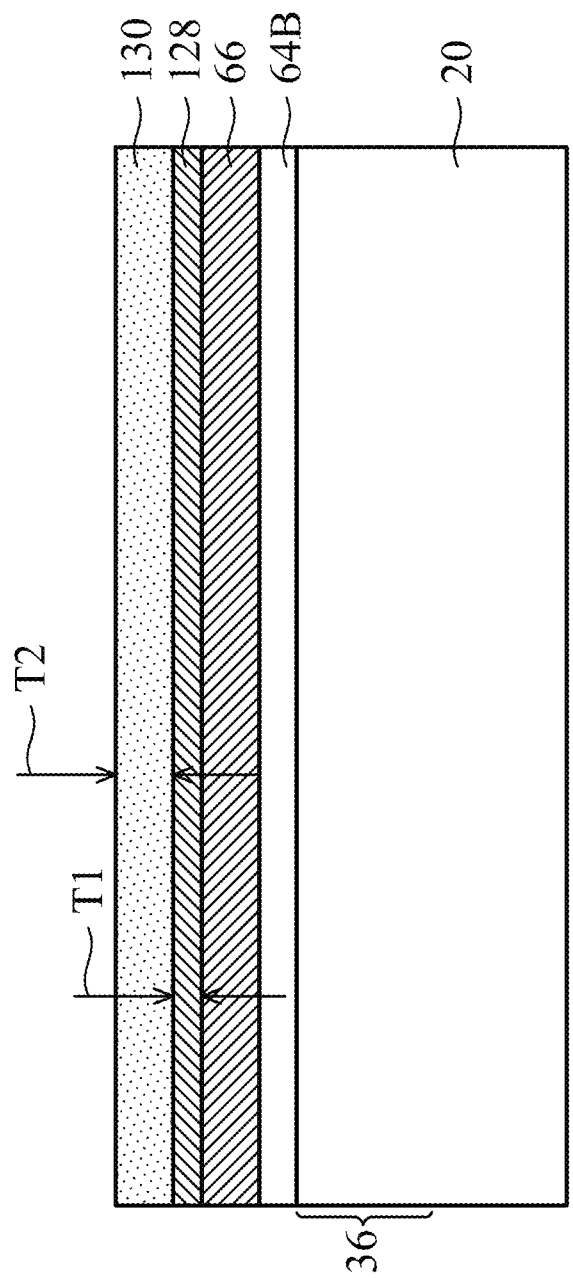

FIG. 14 illustrates the deposition of blocking layer 128 and metal layer 130. The respective process is illustrated as processes 228 and 230 in the process flow 200 shown in FIG. 33. In accordance with some embodiments, blocking layer 128 comprises or is a TiN layer, a TaN layer, or composite layers thereof. The deposition process may include CVD, ALD, and the like. The metal in metal layer 130 is selected to be able to penetrate through blocking layer 128 when annealed, and able to form an intermixing layer having desirable properties, as discussed in subsequent paragraphs. The metal in metal layer 130 is selected to be able to scavenge the Oxygen from Interfacial layer without creating extra vacancies in high k dielectric layer, such that the selected metal layer 130's oxide have more stability than the SiOx and GeOx and less stability than the high-k oxide. In accordance with some embodiments, metal layer 130 includes Al, Ti, Hf, Zr, Ta, Cr, W, V, Mo or alloys thereof. The deposition method may include Physical Vapor Deposition (PVD), or Atomic layer deposition (ALD) or Plasma enhanced Atomic layer deposition (PEALD) or Chemical vapor deposition (CVD) for example.

Figure 15:
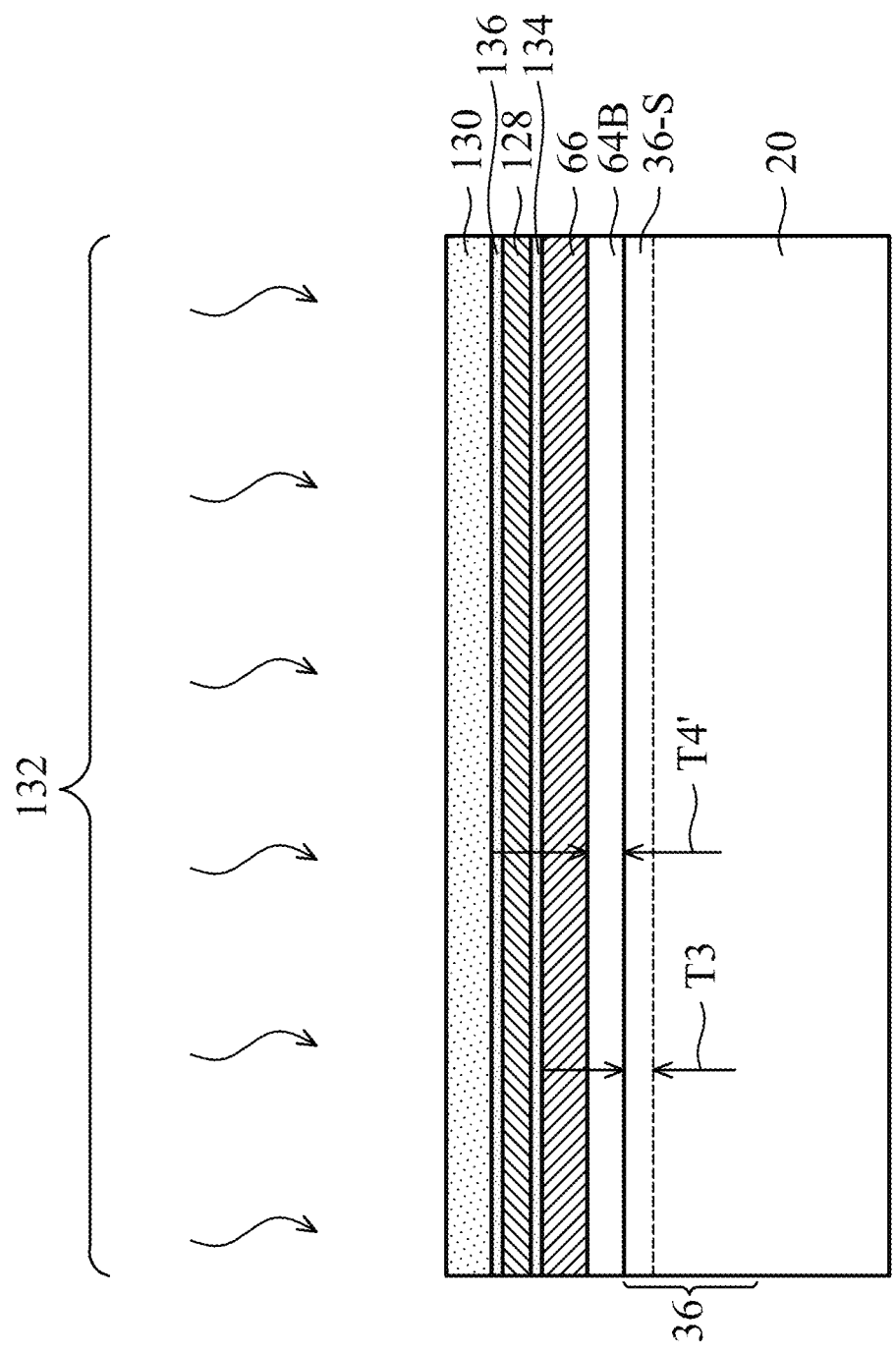

The thickness T1 of blocking layer 128 is selected so that in a subsequent annealing process as shown in FIG. 15, it may function to block excessive diffusion of the metal in metal layer 130 into high-k dielectric layer 66, while at the same time allowing enough amount of metal in metal layer 130 to reach the interface between blocking layer 128 and high-k dielectric layer 66 to form an intermixing layer. Blocking layer 128 also allows oxygen atoms in IL 64B and IL 64A to penetrate through upwardly to reach metal layer 130. In accordance with some embodiments, thickness T1 is in the range between about 5 Å and about 40 Å. If thickness T1 is too big such as greater than about 40 Å, oxygen atoms cannot diffuse upwardly through blocking layer 128, and the purpose of the subsequently performed annealing process is defeated. If thickness T1 is too small such as smaller than about 5 Å, excessive metal atoms in metal layer 130 will diffuse downwardly, penetrate through blocking layer 128, and diffuse into high-k dielectric layer 66. The diffused metal atoms in high-k dielectric layer 66 will thus adversely affect the property of high-k dielectric layer 66. Thickness T2 of metal layer 130 may be in the range between about 5 Å and about 150 Å.

FIG. 15 illustrates a Post-Deposition-Anneal (PDA) process 132. The respective process is illustrated as process 232 in the process flow 200 shown in FIG. 33. The PDA process may be performed using furnace anneal, flash anneal, or the like. The temperature and the annealing duration are controlled, so that desirable effect is achieved, as discussed in subsequent paragraphs, while no adverse effect is resulted. For example, if the temperature is too high and/or the anneal duration is too long, the metal in metal layer 130 may diffuse into the entire high-k dielectric layer 66, degrading its property and also High-k film may crystallize. If the temperature is too low or the anneal duration is too short, the desirable effect is not achieved. Accordingly, the PDA process 132 may be performed at a temperature in a range between about 400° C. and about 535° C. The annealing duration may be in the range between about 15 seconds and about 45 seconds. The PDA process 132 may be performed with a process gas comprising $N_2$, $H_2$, Ar, He, and/or the like.

In the PDA process 132, the germanium oxide in IL 64B is decomposed in the PMOS device region 21P and the silicon oxide in IL 64A is decomposed in NMOS device region 21N. The silicon oxide in IL 64B is more stable than germanium oxide, and is not decomposed. This preferential decomposition of germanium oxide in IL 64B causes the decrease in the ratio of the germanium atomic percentage to the silicon atomic percentage in the IL 64B. The oxygen atoms in the decomposed germanium oxide diffuse upwardly into metal layer 130, and forms metal oxide layer 136 with a bottom portion (or an entirety) of metal layer 130. For example, depending on whether metal layer 130 comprises Al, Ti, Hf, Ta, Cr, W, V, Mo or Zr, metal oxide layer 136 may comprise aluminum oxide, titanium oxide, hafnium oxide, or zirconium oxide, respectively.

In the PDA process 132, the germanium atoms in the decomposed germanium oxide diffuses downwardly into a top surface portion of protruding fin 36, and forms germanium-rich layer 36-S, which forms at least a portion of the channel region of the respective transistor. Due to the extra germanium atoms added into the top surface portion of protruding fin 36, the germanium atomic percentage in germanium-rich layer 36-S is higher than the germanium atomic percentage in the original top surface portion of protruding fin 36 by ΔC, and higher than the germanium atomic percentage in the lower portion of protruding fins 36 also by ΔC. The atomic percentage difference AC may be in the range between about 1 percent and about 4 percent. Thickness T3 of germanium-rich layer 36-S may be in the range between about 0.5 nm and about 1 nm.

Due to the decomposition of the germanium oxide and the out-diffusion of germanium atoms and oxygen atoms, the thickness of IL 64B is reduced in PMOS device region 21P. In addition, due to the decomposition of the silicon oxide and the out-diffusion of oxygen atoms, the thickness of IL 64A is reduced in NMOS device region 21N. For example, before the deposition of metal layer 130, the thickness T4 of IL 64B or IL 64A (FIG. 13) is T4. After the PDA process 132, the thickness of one of IL 64B and IL 64A, or both, is reduced to T4' (FIG. 15), which is in the range between about 25%*T4 and about 80%*T4. For example, T4 may be in the range between about 10 Å and about 120 Å, and thickness T4' may be in the range between about 2 Å and about 80 Å. The EOT of the resulting gate dielectric is thus reduced.

Figure 18:
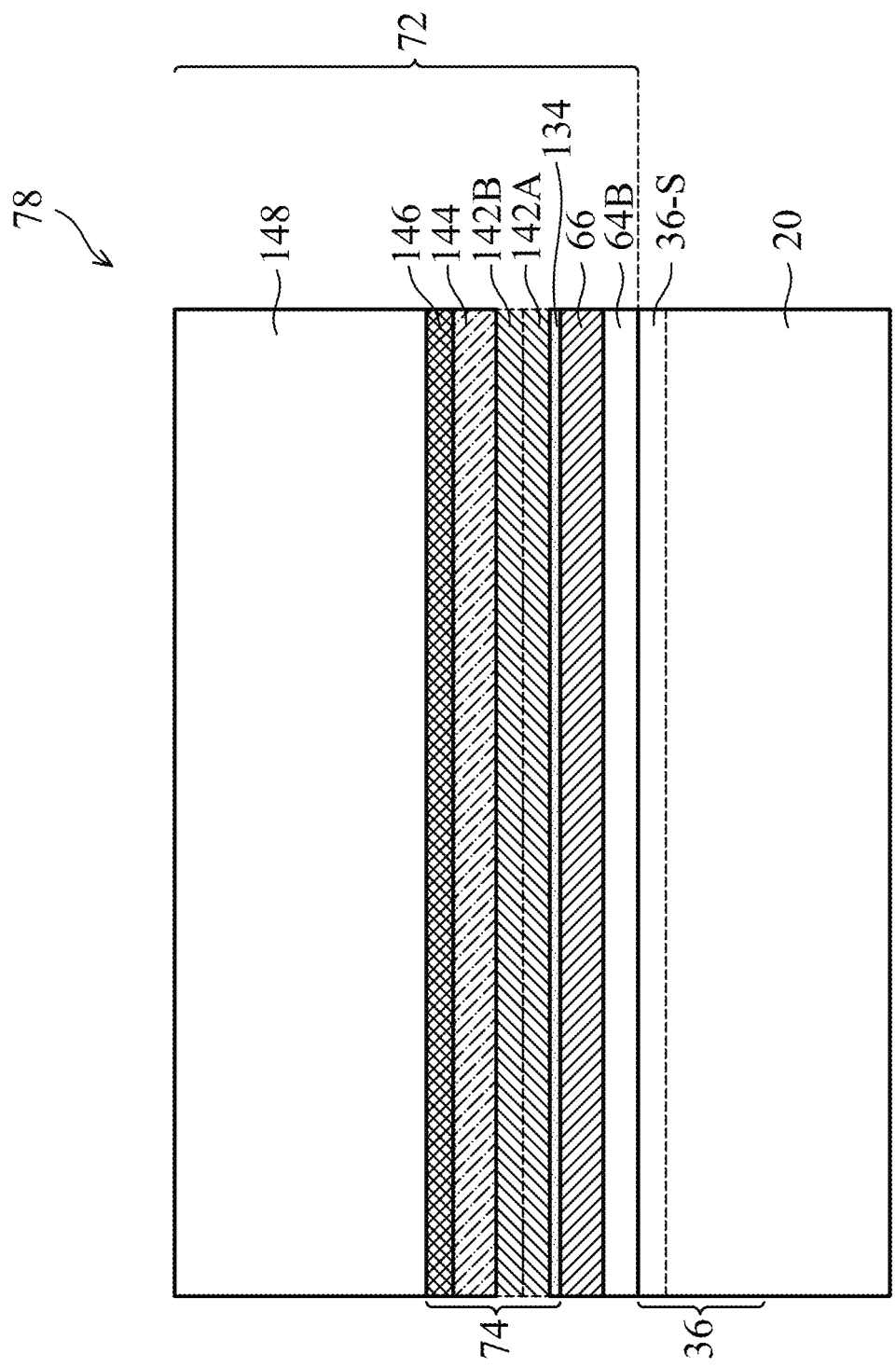

In the PDA process 132, intermixing layer 134 is also formed at the boundary regions of high-k dielectric layer 66 and blocking layer 128. The intermixing layer 134 includes the metal (such as Hf) from high-k dielectric layer 66, the oxygen diffused from IL 64B, the metal diffused from metal layer 130, and the metal (such as Ti) from blocking layer 128. The metal from metal layer 130 may be the same or different from the metal(s) in high-k dielectric layer 66, and may be the same or different from the metal(s) in layers 142A, 142B, 144, 146, and 148 (FIG. 18). In accordance with some embodiments, intermixing layer 134 includes Mx—Ti—Hf—O, wherein Mx is the metal in metal layer 130. Intermixing layer 134 is a dielectric layer, and may be Ti-rich, Zr-rich, Al-rich, or Hf-rich, depending on the metal in metal layer 130. Intermixing layer 134 has some advantageous features. For example, the Ti-rich and Zr-rich intermixing layer 134 has a dielectric constant $k_{IM}$ higher than the dielectric constant $k_{HK}$ of high-k dielectric layer 66, for example, with the k-value difference ($k_{IM}-k_{HK}$) being greater than about 1, and may be in the range between about 1 and 8. Intermixing layer 134 has the function of blocking the overlying work function metal layers (formed subsequently) from diffusing into high-k dielectric layer 66, thereby improving the high-k film quality, leakage, and the reliability of the respective device. Also, the Al-rich intermixing layer 134 helps to boost p-type dipole, and may reduce the threshold voltage of the p-type transistors. The Zr-rich intermixing layer 134 may stabilize tetragonal phase in the high-k dielectric layer 66, and may improve the thermal stability of high-k dielectric layer 66.

Figure 25:
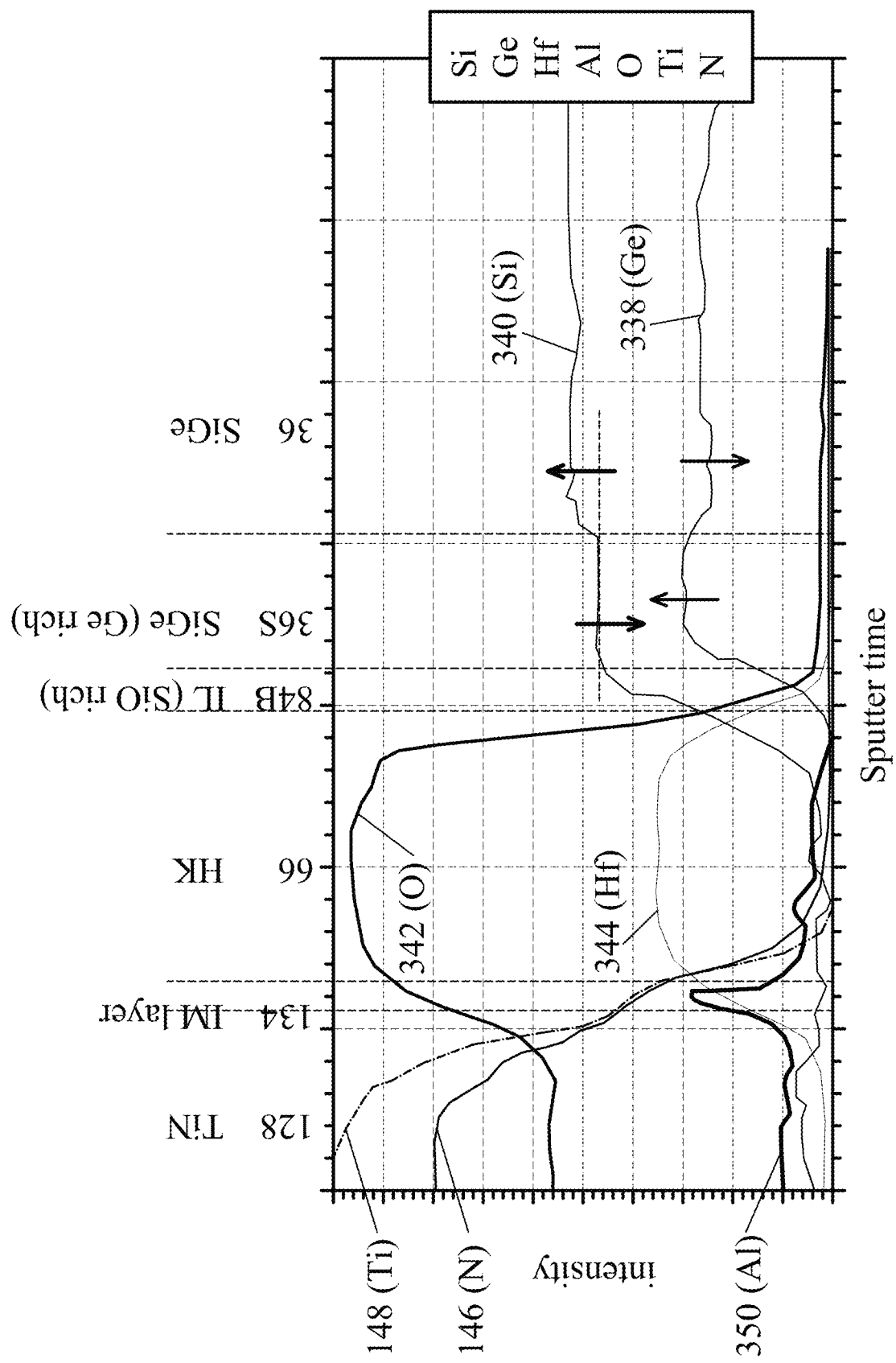
FIGS. 25 through 30 illustrate the results of the sample FinFETs in accordance with some embodiments.

FIG. 25 illustrates a composition profile of some elements in various layers as shown in FIG. 15 in accordance with some embodiments. The composition profile is measured from a sample wafer having the structure in FIG. 15 formed thereon. The example elements in the illustrated layers are marked for easier understanding. For example, the sample structure has the metal layer 130 formed of Hf, and the blocking layer 128 formed of TiN. In FIG. 25, lines 338, 340, 342 and 344 represent the atomic percentages of Ge, Si, O, Hf, N, Ti, and Al, respectively. The Ge atomic percentage (line 338) in germanium-rich SiGe layer 36-S is higher than in SiGe protruding fin 36, hence the name germanium-rich. Correspondingly, the Si atomic percentage (line 340) in germanium-rich SiGe layer 36-S is lower than in SiGe protruding fin 36.

FIG. 25 further illustrates that the IL layer 64B has significantly lower germanium-to-silicon ratio than in both of Ge-rich SiGe layer 36-S and protruding fin 36, clearly indicating that germanium atoms have diffused out to Ge-rich SiGe layer 36-S. Intermixing layer 134 is also clearly shown, which has high atomic percentages of Hf, O, Ti, and Al.

Figure 26:
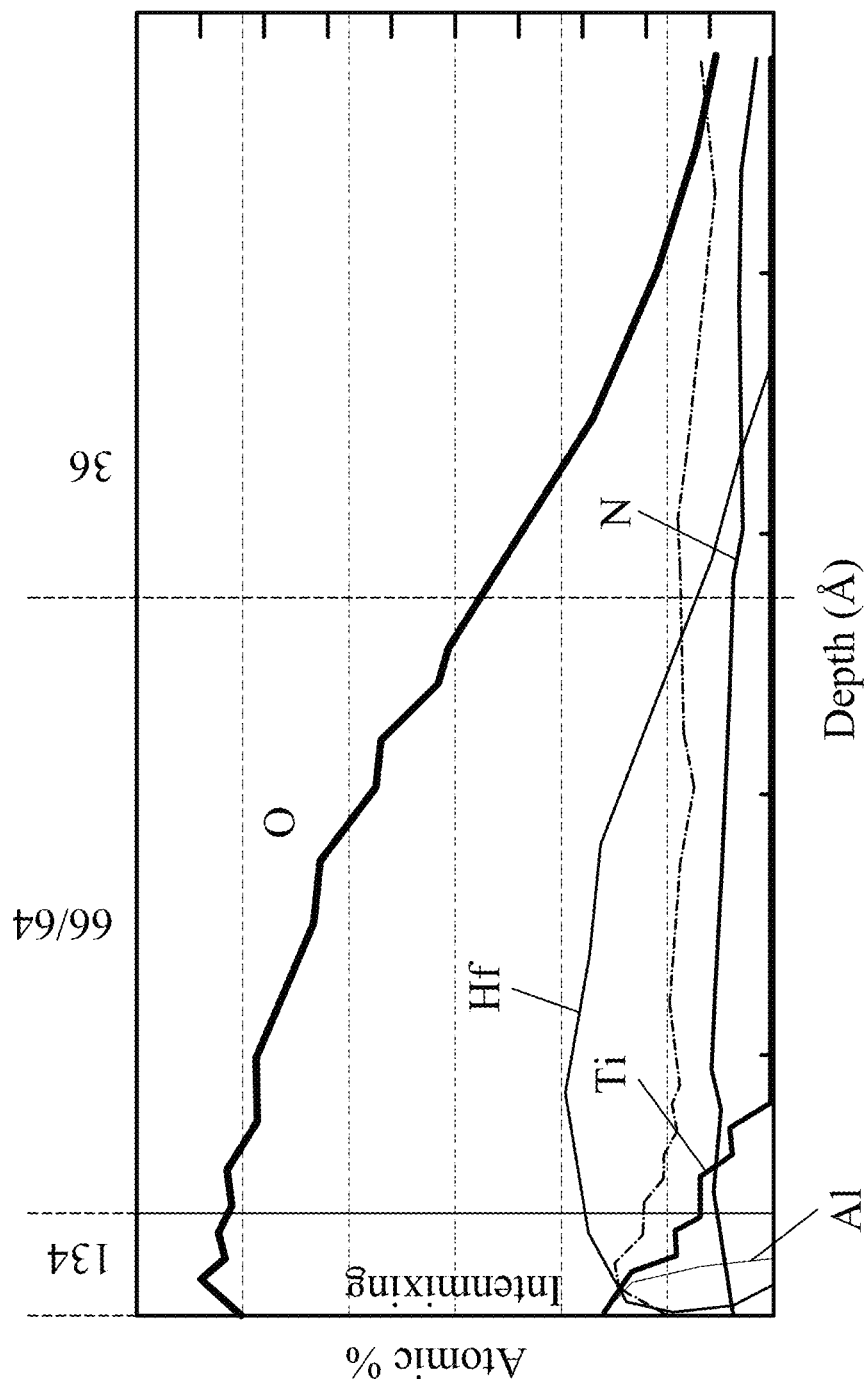

FIG. 26 illustrates the atomic percentages of some elements in intermixing layer 134, high-k dielectric layer 66 and IL 64B, and protruding fin 36 (including Ge-rich SiGe layer 36-S), wherein the X-axis represents the depth measured from the top surface of wafer 10, and the Y-axis represents the atomic percentages. The elements are marked. Also, the intermixing layer 134 can also be observed clearly.

Figure 16:
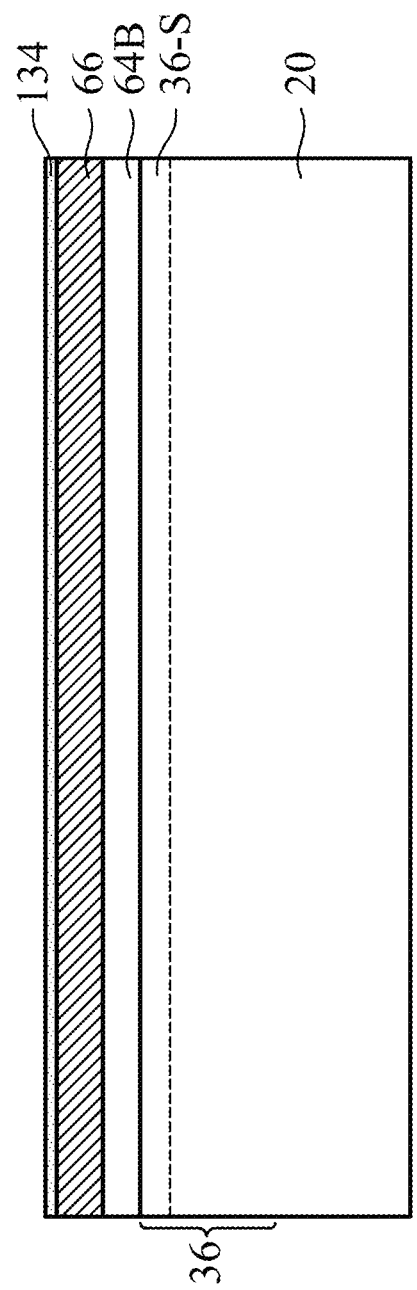

Next, the blocking layer 128, metal oxide layer 136, and metal layer 130 as shown in FIG. 15 are etched, and the resulting structure is shown in FIG. 16. The respective process is illustrated as process 234 in the process flow 200 shown in FIG. 33. The etching chemical may be selected depending upon the materials of metal layer 130 and blocking layer 128, and may be selected from $NH_4OH$, HCl, HF, $H_3PO_4$, $H_2O_2$, $H_2O$, and combinations thereof. For example, when metal layer 130 comprises Al, Ti, Hf, and/or Zr and when blocking layer 128 comprises TiN, the etching chemical may include one or both of $NH_4OH$ and HCl, and further includes $H_2O_2$ and $H_2O$. When metal layer 130 comprises Al, Ti, Hf, Ta, Cr, W, V, Mo and/or Zr and when blocking layer 128 comprises TaN, the etching chemical may include the mixture of HF, $NH_4OH$, $H_2O_2$, and $H_2O$. After the etching, intermixing layer 134 is revealed.

Figure 17:
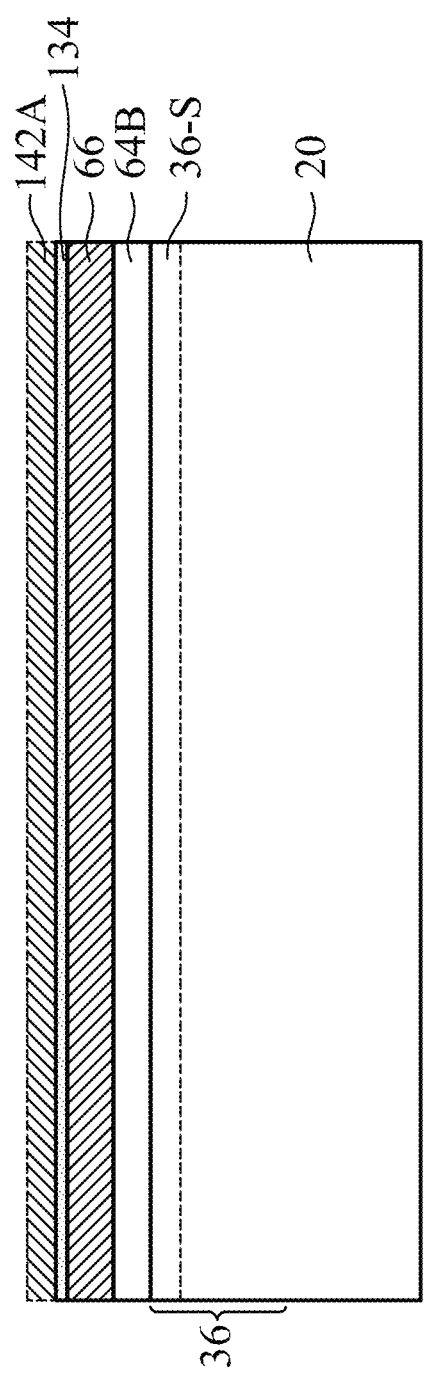

FIG. 17 illustrates the deposition of barrier layer 142A in accordance with some embodiments. The respective process is illustrated as process 236 in the process flow 200 shown in FIG. 33. Barrier layer 142A is also sometimes referred to as an adhesion layer, which may be formed of TiN, TaN, or the like.

After barrier layer 142A is formed, there may be (or may not be) another barrier layer 142B deposited on barrier layer 142A. In accordance with other embodiments, neither of layers 142A and 142B is formed, and the subsequently formed work-function layer 144 is in contact with intermixing layer 134.

Next, as also shown in FIG. 18, work-function layer 144 is formed over barrier layer 142B (if formed). The respective process is illustrated as process 238 in the process flow 200 shown in FIG. 33. Work-function layer 144 determines the work function of the gate, and includes at least one layer, or a plurality of layers formed of different materials. In accordance with some embodiments, work-function layer 144 may include a TaN layer, a TiN layer over the TaN layer, and a TiAl layer over the TiN layer. It is appreciated that the work-function layers may include different materials, which are also contemplated.

In accordance with some embodiments of the present disclosure, a metal capping layer 146 is formed over work-function layer 144, as shown in FIG. 18. The respective process is illustrated as process 240 in the process flow 200 shown in FIG. 33. Metal capping layer 146 may be formed of a metal nitride such as TiN in accordance with some embodiments, and other materials such as TaN may be used. Layers 142A, 142B, 144, and 146 collectively correspond to stacked layers 74 in FIG. 10B.

FIG. 18 illustrates the formation of filling-metal region 148, which corresponds to filling-metal region 76 in FIG. 10B. The respective process is illustrated as process 242 in the process flow 200 shown in FIG. 33. The stack including intermixing layer 134 and the overlying layers corresponding to the stacked layers 74 in FIG. 10B. In accordance with some embodiments, filling-metal region 148 is formed of tungsten or cobalt, which may be formed using ALD, CVD, or the like. After the formation of filling-metal region 148, a planarization process may be performed to remove excess portions of the deposited layers as shown in FIG. 18, resulting in the gate stacks 72 as shown in FIGS. 10A and 10B.

Figure 19:
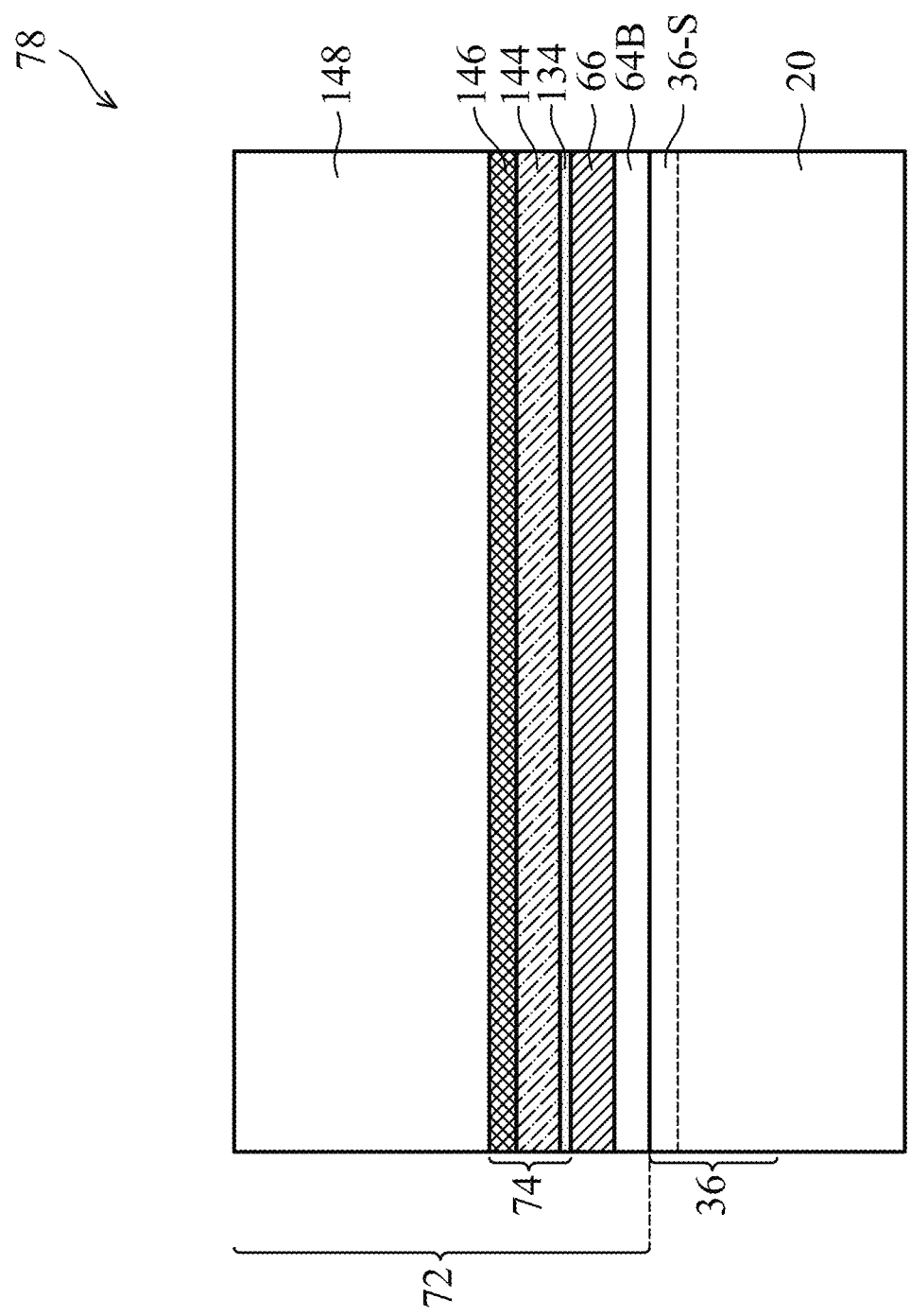
FIGS. 19 and 20 illustrate the cross-sectional views of some portions of gate stacks of FinFETs in accordance with some embodiments.
Figure 20:
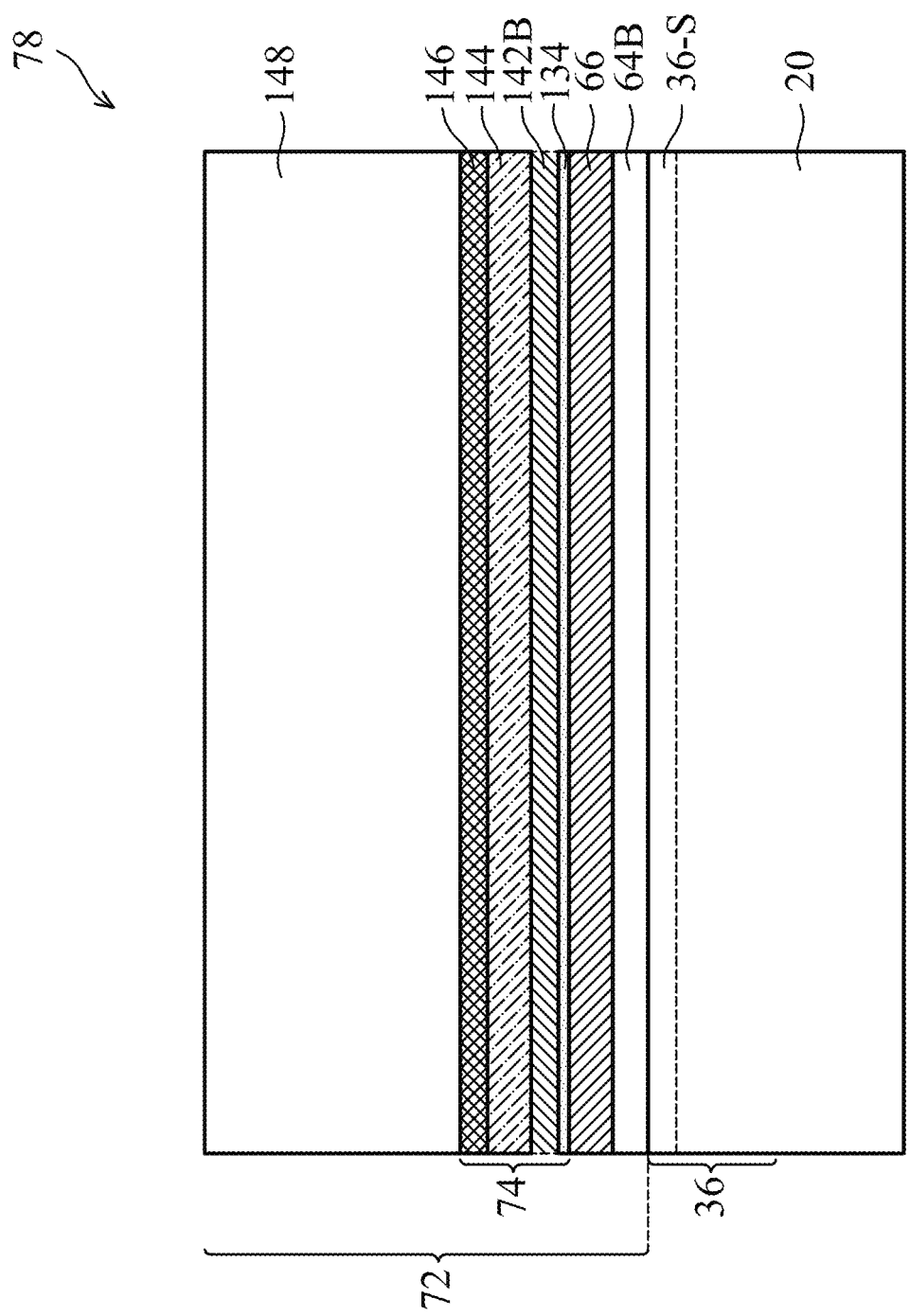

As aforementioned, diffusion barriers 142A and 142B may or may not be formed. When diffusion barriers 142A and 142B are not formed, the resulting gate stack 72 is as shown in FIG. 19, in which work-function layer 144 is over and in physical contact with intermixing layer 134. In accordance with other embodiments, diffusion barrier 142B may be formed, while diffusion barrier 142A is not formed. The corresponding gate stack 72 is shown in FIG. 20, in which work-function layer 144 is over and in physical contact with diffusion barrier 142B.

Figure 21:
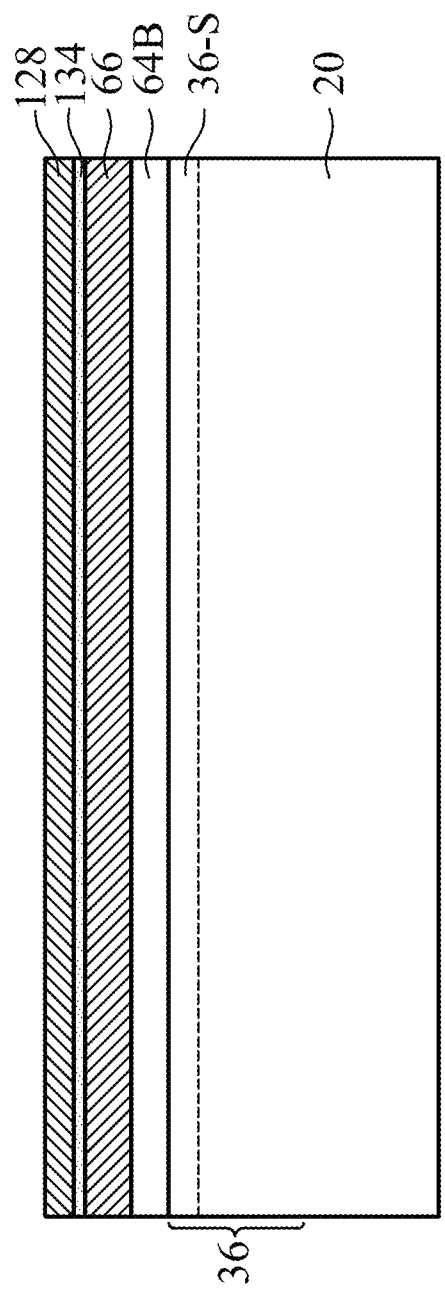
FIGS. 21 and 22 illustrate the cross-sectional views of intermediate stages in the formation of a gate stack of a FinFET in accordance with some embodiments.
Figure 22:
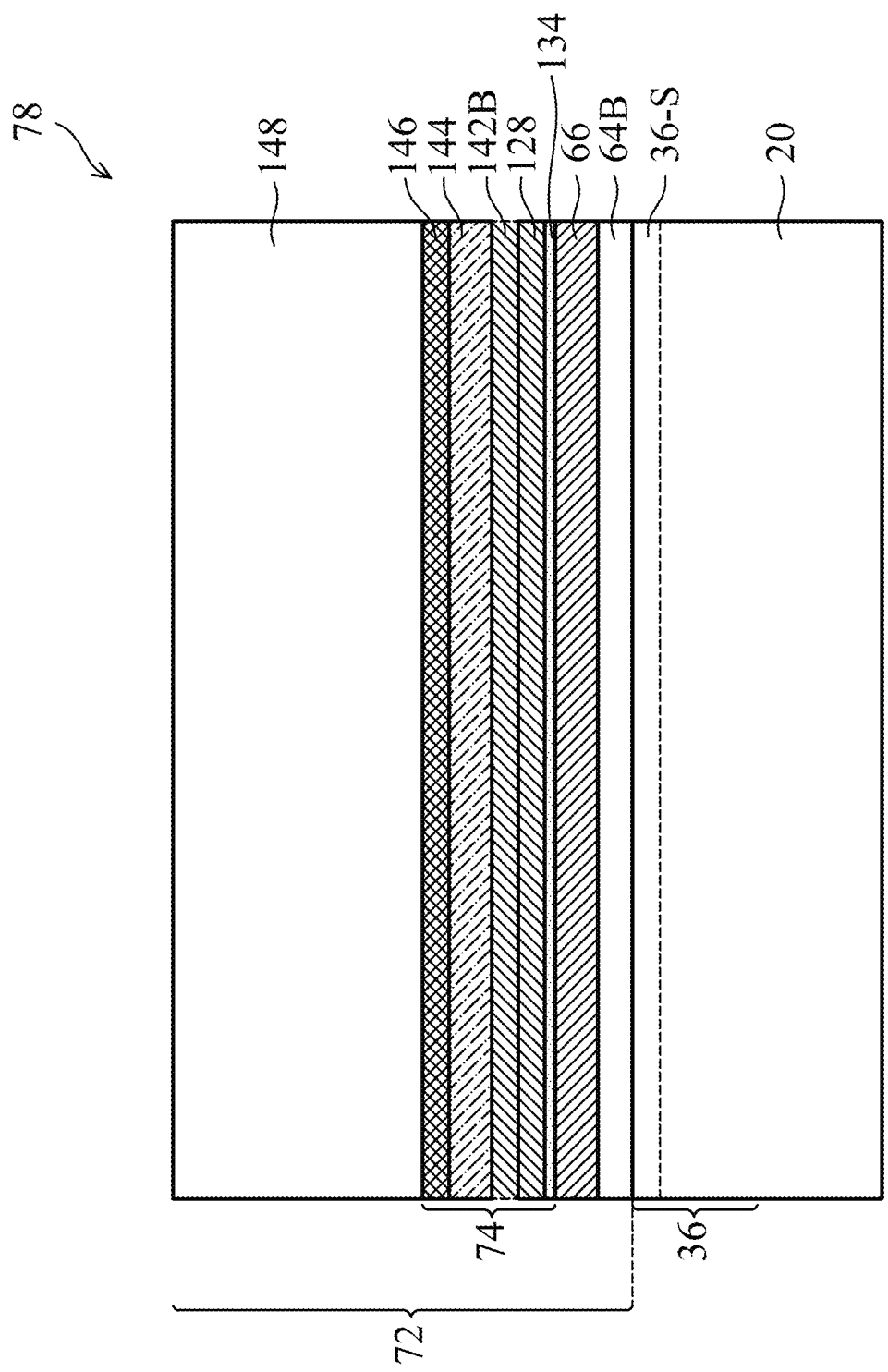

FIGS. 21 and 22 illustrate the intermediate stages in the formation of gate stack 72 in accordance with alternative embodiments. Unless specified otherwise, the materials and the formation processes of the components in these embodiments are essentially the same as the like components, which are denoted by like reference numerals in the preceding embodiments shown in FIGS. 1 through 18. The details regarding the formation process and the materials of the components shown in FIGS. 21 and 22 may thus be found in the discussion of the preceding embodiments.

The initial steps of these embodiments are essentially the same as shown in FIGS. 1-6, 7A, 7B, 8A, 8B, 9, 10A, 10B, and 11-15. In a subsequent process, metal layer 130 and metal oxide layer 136 as shown in FIG. 15 are removed in an etching process, while blocking layer 128 is not etched, as shown in FIG. 21. The corresponding etching process is thus referred to as a partial etching process. In accordance with some embodiments, when metal layer 130 comprises Al, Ti, Hf, Ta, Cr, W, V, Mo and/or Zr and when blocking layer 128 comprises TiN, the partial etching chemical may include the mixture of HF, $NH_4OH$, $H_2O_2$, and $H_2O$. When metal layer 130 comprises Al, Ti, Hf, Ta, Cr, W, V, Mo and/or Zr and when blocking layer 128 comprises TaN, the etching chemical may be selected from the mixture of $H_2O_2$, $H_3PO_4$, and $H_2O$, the mixture of $NH_4OH$, $H_2O_2$, and $H_2O$, the mixture of HCl, $H_2O_2$, and $H_2O$, or the mixture of $NH_4OH$, HCl, $H_2O_2$, and $H_2O$. After the partial etching process, blocking layer 128 is left, as shown in FIG. 21. Blocking layer 128 is formed of similar material as, and has the same function as, diffusion barrier layer 142A as shown in FIG. 18. FIG. 22 illustrates the overlying diffusion barrier layer 142B, work-function layer 144, capping layer 146, and filling metal 148. Similarly, diffusion barrier layer 142B may or may not be formed.

Figure 23:
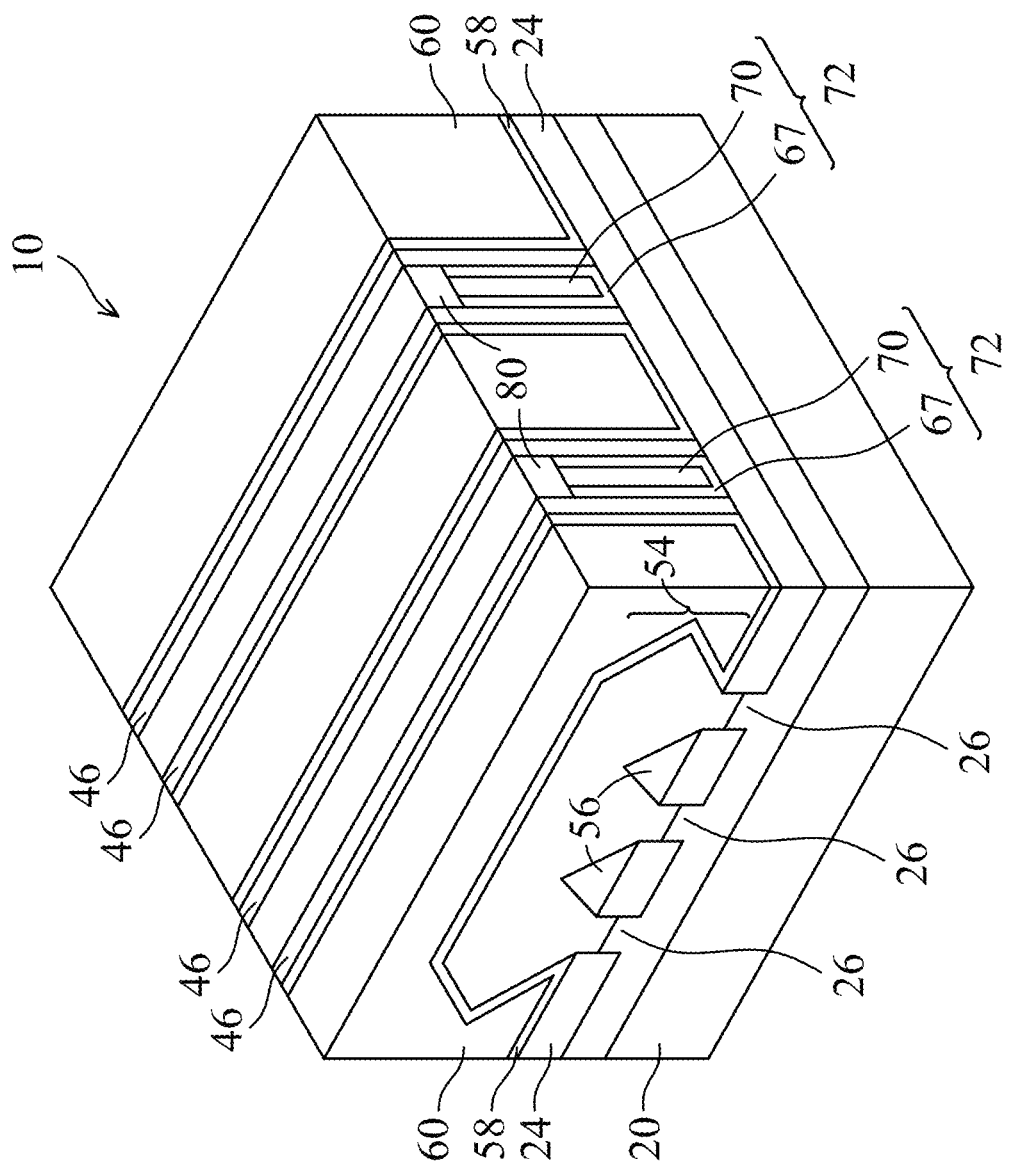

FIG. 23 illustrates the formation of hard masks 80 in accordance with some embodiments. The formation of hard masks 80 may include performing an etching process to recess gate stacks 72, so that recesses are formed between gate spacers 46, filling the recesses with a dielectric material, and then performing a planarization process such as a CMP process or a mechanical grinding process to remove excess portions of the dielectric material. Hard masks 80 may be formed of silicon nitride, silicon oxynitride, silicon oxy-carbo-nitride, or the like.

Figure 24:
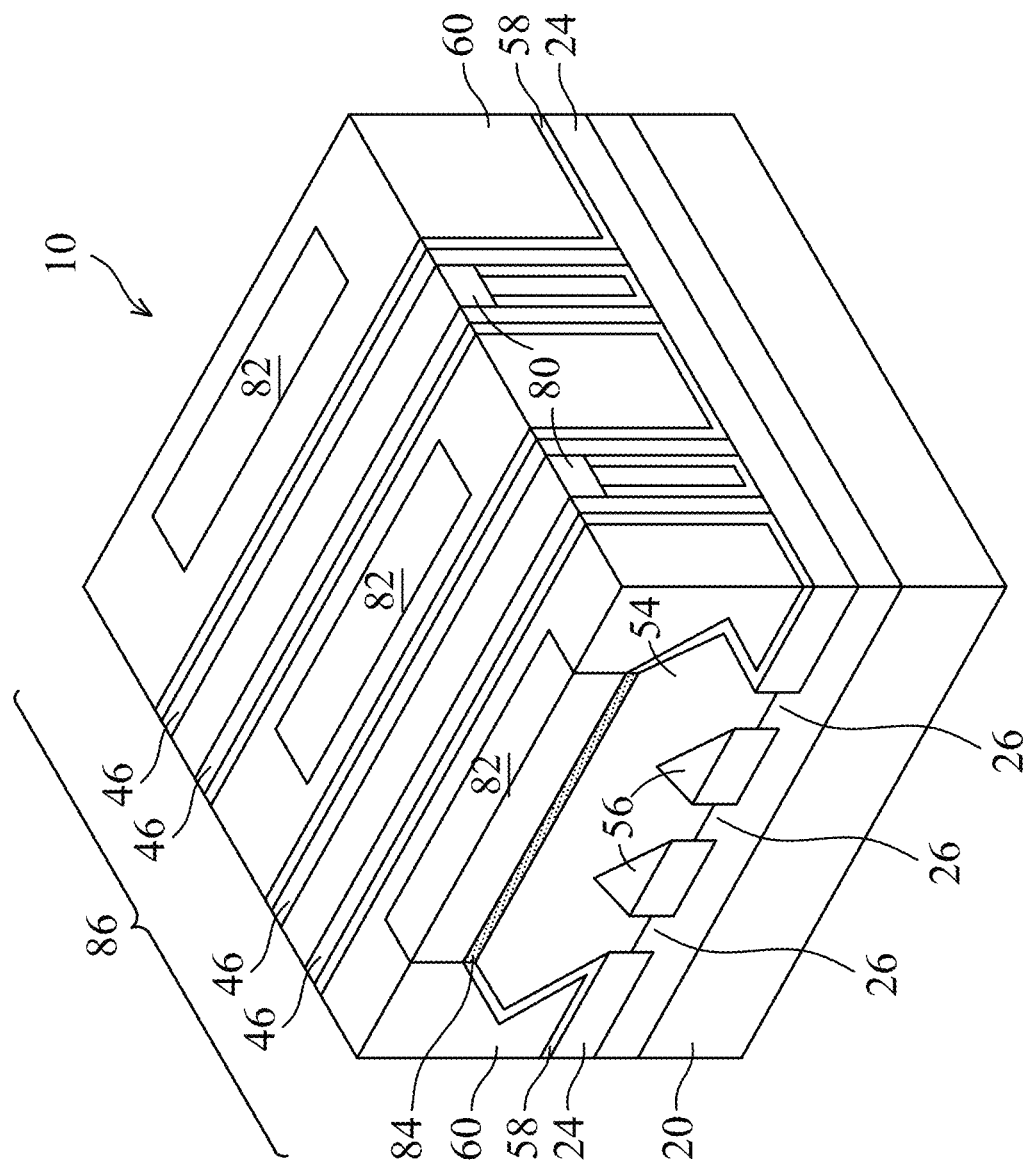

FIG. 24 illustrates the formation of source/drain contact plugs 82. The formation of source/drain contact plugs 82 include etching ILD 60 to expose the underlying portions of CESL 58, and then etching the exposed portions of CESL 58 to reveal source/drain regions 54. In a subsequent process, a metal layer (such as a Ti layer) is deposited and extending into the contact openings. A metal nitride capping layer may be formed. An anneal process is then performed to react the metal layer with the top portion of source/drain regions 54 to form silicide regions 84, as shown in FIG. 24. Next, either the previously formed metal nitride layer is left without being removed, or the previously formed metal nitride layer is removed, followed by the deposition of a new metal nitride layer (such as a titanium nitride layer). A filling-metallic material such as tungsten, cobalt, or the like, is then filled into the contact openings, followed by a planarization to remove excess materials, resulting in source/drain contact plugs 82. Gate contact plugs (not shown) are also formed to penetrate through a portion of each of hard masks 80 to contact gate electrodes 70. FinFETs 86, which may be connected in parallel as one FinFET, is thus formed.

Figure 27:
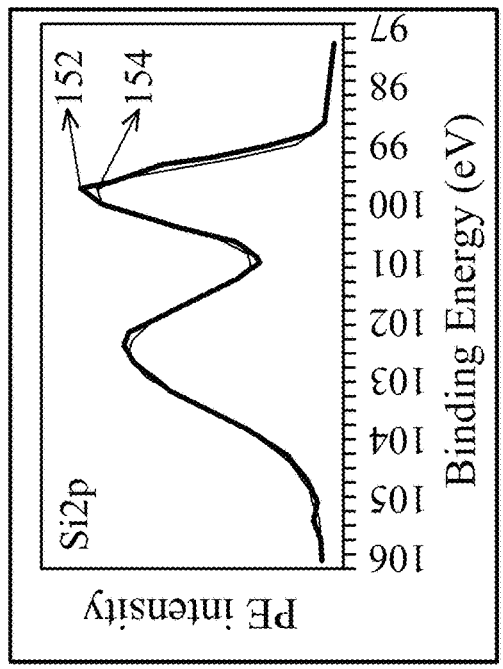

FIG. 27 illustrates the binding energies of silicon in PMOS device region 21P. The peaks close to the binding energy of 102.8 eV represent the Si—O bonds, which correspond to the IL 64B. The peaks close to the binding energy of 100 eV represent the Si—Si bonds and/or Si—Ge bonds, which correspond to the channel regions. Signal intensity line 152 is obtained from a first sample formed using conventional methods, in which metal layer 130 (FIG. 15) is not formed, and the anneal process 132 (FIG. 15) is not performed. Signal intensity line 154 is obtained from a second sample formed in accordance with some embodiments of the present disclosure, in which the metal layer 130 (FIG. 15) is formed, and the anneal process 132 (FIG. 15) is performed. The experiment results reveal that at the peak close to the binding energy of 102.8 eV (FIG. 27), the signal intensity of line 154 is higher than the signal intensity of line 152, indicating that in the IL of the second sample, silicon atomic percentage is increased over that in the first sample, which also means germanium atomic percentage is reduced in the IL 64B due to the germanium diffusion. At the peak close to the binding energy of 100 eV (FIG. 27), the signal intensity of line 154 is lower than the signal intensity of line 152, indicating that in the Ge-rich SiGe layer 36-S, silicon atomic percentage is reduced in the second sample than in the first sample, which also means germanium atomic percentage is increased in the channel.

Figure 28:
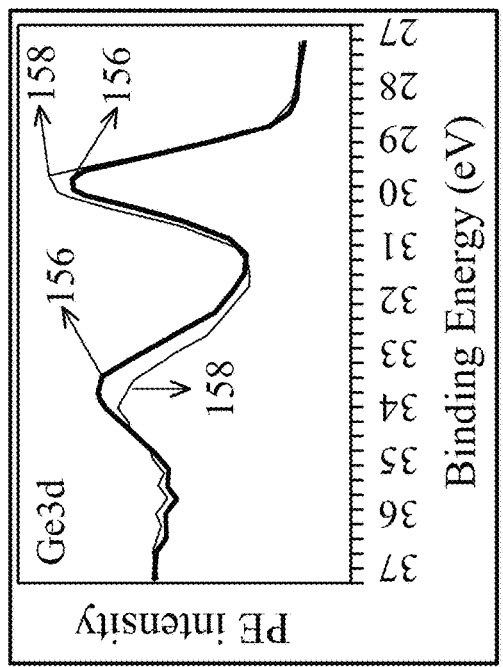
Figure 29:
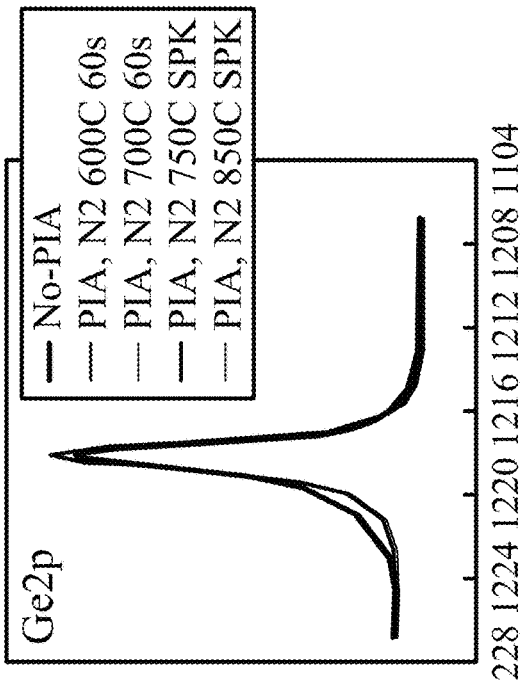

FIGS. 28 and 29 illustrate the binding energies of germanium. The signal intensity close to the binding energy of 33.5 eV in FIG. 28 and 1,222 eV in FIG. 29 represents the Ge—O bonds, which correspond to the IL 64B. The peaks close to the binding energy of 30 eV in FIG. 28 and 1,218 eV in FIG. 29 represent the Ge—Si bonds and Ge—Ge bonds, respectively, which corresponds to the channel regions. Signal intensity line 156 is obtained from the first sample formed using conventional methods. Signal intensity line 158 is obtained from the second sample formed in accordance with some embodiments of the present disclosure. The experiment results reveal that close to the binding energy of 33.5 eV (FIG. 28) and 1,222 eV (FIG. 29), the signal intensity of the line 158 is lower than the signal intensity of the signal intensity line 156, indicating that in the IL of the second sample, germanium atomic percentage is reduced, indicating less Ge—O bonds in IL 64B due to the scavenging of oxygen from germanium oxide in IL into the metal layer 130 and the out-diffusion of germanium into channel. At the peak close to the binding energies of 30 eV (FIG. 28) and 1,218 eV (FIG. 29), the signal intensity of line 158 is higher than the signal intensity of line 156, indicating that in the Ge-rich SiGe layer 36-S, the germanium atomic percentage is increased.

Figure 30:
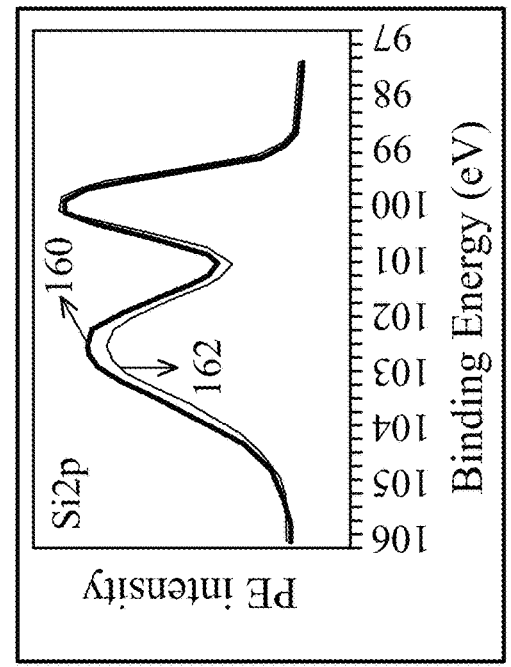

FIG. 30 illustrates the binding energies of silicon in NMOS device region 21N. The peaks close to the binding energy of 102.8 eV represent the Si—O bonds, which correspond to the IL 64A. The peaks close to the binding energy of 100 eV represent the Si—Si bonds, which correspond to the Si channel regions. Signal intensity line 160 is obtained from the first sample formed using conventional methods, in which metal layer 130 (FIG. 15) is not formed, and the anneal process 132 (FIG. 15) is not performed. Signal intensity line 162 is obtained from the second sample formed in accordance with some embodiments of the present disclosure, in which the metal layer 130 (FIG. 15) is formed, and the anneal process 132 (FIG. 15) is performed. The experiment results reveal that at the peak close to the binding energy of 102.8 eV (FIG. 30), the signal intensity of line 162 is lower than the signal intensity of line 160, indicating that in the IL 64A of the second sample, silicon atomic percentage is decreased over that in the first sample, which also means IL 64A thickness is reduced.

Figure 31:
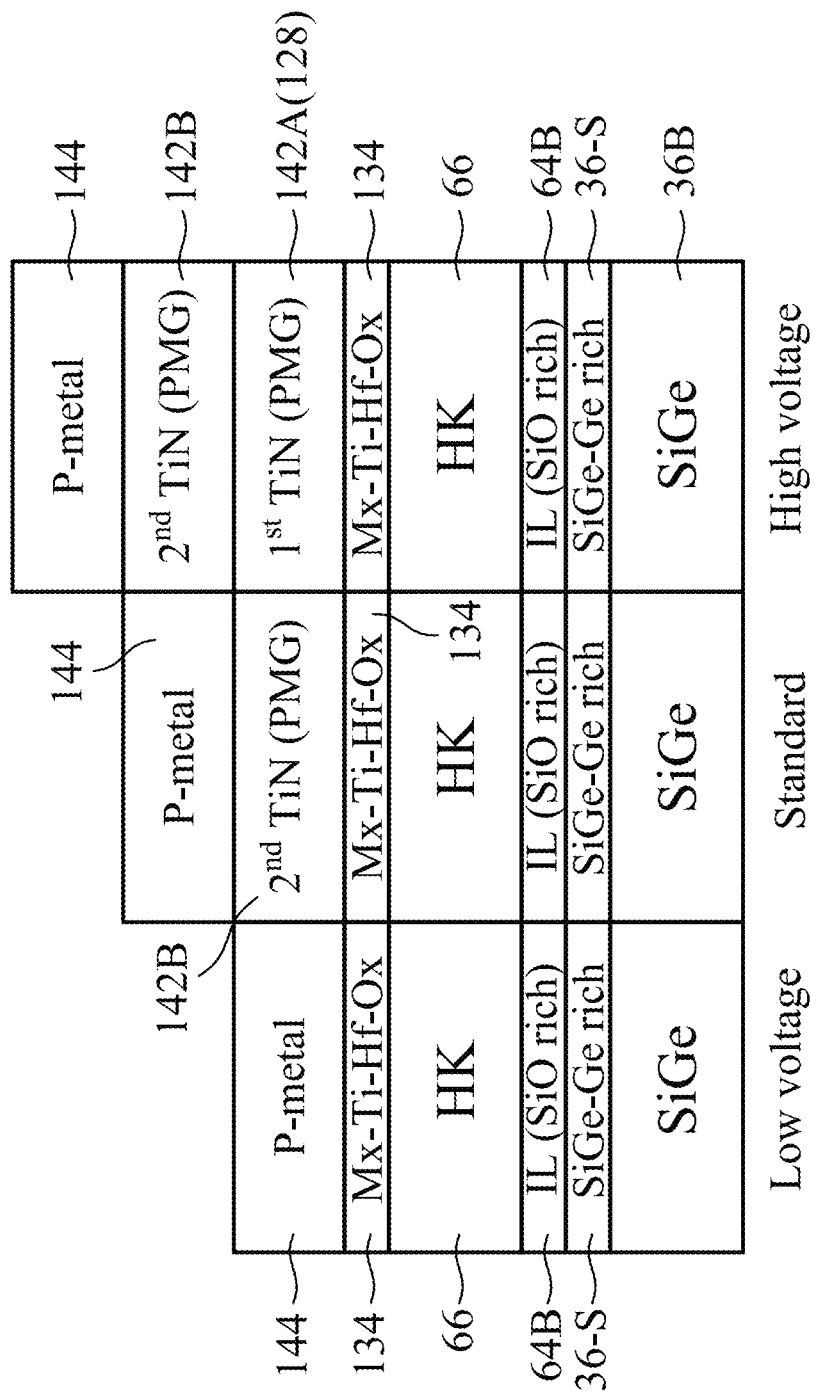

FIG. 31 illustrates the comparison of the stacking scheme of a low-voltage p-type transistor, a standard-voltage p-type transistor, and a high-voltage p-type transistor in accordance with some embodiments. These devices differ from each other in that whether they include diffusion barrier layers 142A (or 128) and 142B. The formation of these transistors may share common processes for forming IL 64, high-k dielectric layer 66, intermixing layer 134, and work function layer 144. To form diffusion barrier layers 142A and 142B differently for different transistors, a first diffusion barrier layer 142A may be formed in all three transistor regions, and then removed from both of the low-voltage and standard-voltage transistor regions. Next, a second diffusion barrier layer 142B may be formed in all three transistor regions, and then removed from the low-voltage transistor region. The thin IL layer 64B includes silicon-rich and germanium-deficit oxide, and the work-function layers 144 include P-type work function metals. Furthermore, Ge-rich SiGe layers 36-S are formed in all three transistor regions.

FIG. 32 illustrates the comparison of the stacking scheme of a low-voltage n-type transistor, a standard-voltage n-type transistor, and a high-voltage n-type transistor in accordance with some embodiments. These devices differ from each other in that whether they include diffusion barrier layers 142A (or 128) and 142B. The corresponding ILs include a thin silicon oxide 64A, and the work-function layers include n-type work function metals. No Ge-rich layer is formed in the channels of all three transistor regions.

The embodiments of the present disclosure have some advantageous features. By forming a metal layer and annealing the metal layer during the formation of a gate of an n-type transistor, oxygen may be deprived from the IL, which includes silicon oxide. By forming a metal layer and annealing the metal layer during the formation of a gate of a p-type transistor, oxygen may be deprived from the IL, which includes silicon oxide and germanium oxide. Germanium is also diffused into the underlying channel. Accordingly, the amount of germanium oxide in the IL is reduced. Germanium oxide is less stable than silicon oxide, and tends to combine with oxygen to form germanium monoxide, with is gaseous and may evaporate to leave vacancies in the IL. Furthermore the oxygen vacancy formation energy is lower in germanium oxide than that compared to silicon oxide or high-k oxide. Thus, germanium oxide in IL contributes to too much defects. Accordingly, the reduction of germanium oxide results in the reduction of defects in the IL and reduction of density of interface traps in p-type transistor. IL is also gets thinner in both n-type transistor and in p-type transistor, and the EOT of the gate dielectric is reduced. The germanium diffused into the channel regions results in the desirable increase in the channel mobility for the p-type transistors. Also, an intermixing layer is formed, which has a high k value and other advantageous features.

In accordance with some embodiments of the present disclosure, a device comprises a semiconductor region; an interfacial layer over the semiconductor region, the interfacial layer comprising a semiconductor oxide; a high-k dielectric layer over the interfacial layer; an intermixing layer over the high-k dielectric layer, wherein the intermixing layer comprises oxygen, a metal in the high-k dielectric layer, and an additional metal; a work-function layer over the intermixing layer; and a filling-metal region over the work-function layer. In an embodiment, the additional metal is selected from the group consisting of aluminum, titanium, hafnium, zirconium, chromium, tantalum, tungsten, vanadium, molybdenum, and combinations thereof. In an embodiment, the semiconductor region comprises: a lower portion comprising silicon germanium having a first germanium atomic percentage; and an upper portion over and contacting the lower portion, wherein the upper portion comprises silicon germanium having a second germanium atomic percentage greater than the first germanium atomic percentage. In an embodiment, the upper portion has a thickness in a range between about 0.5 nm and about 1 nm. In an embodiment, the second germanium atomic percentage is greater than the first germanium atomic percentage by a difference, and the difference is in a range between about 1 percent and about 4 percent. In an embodiment, the work-function layer contacts the intermixing layer. In an embodiment, the device further includes a titanium nitride layer between the intermixing layer and the filling-metal region. In an embodiment, the interfacial layer, the high-k dielectric layer, the intermixing layer, the work-function layer, and the filling-metal region form a gate stack of a transistor.

In accordance with some embodiments of the present disclosure, a device comprises a silicon germanium fin; a gate stack on the silicon germanium fin, wherein the gate stack comprises: an interfacial layer contacting the silicon germanium fin; a high-k dielectric layer over the interfacial layer; an intermixing layer over and contacting the high-k dielectric layer, wherein the high-k dielectric layer has a first dielectric constant, and the intermixing layer has a second dielectric constant greater than the first dielectric constant; and a titanium nitride layer over and contacting the intermixing layer; and a source/drain region on a side of the gate stack. In an embodiment, the intermixing layer comprises a metal different from metals in the high-k dielectric layer and layers in the gate stack and overlying the intermixing layer. In an embodiment, the intermixing layer comprises oxygen and a metal selected from the group consisting of aluminum, titanium, hafnium, zirconium, and combinations thereof. In an embodiment, the silicon germanium fin comprises: a lower portion having a first germanium atomic percentage; and an upper portion over and contacting the lower portion, wherein the upper portion has a second germanium atomic percentage higher than the first germanium atomic percentage. In an embodiment, at an interface between the lower portion and the upper portion, there is an abrupt increase from the first germanium atomic percentage to the second germanium atomic percentage. In an embodiment, the silicon germanium fin, the gate stack, and the source/drain region are parts of a p-type transistor.

In accordance with some embodiments of the present disclosure, a method comprises forming an interfacial layer over a semiconductor region, wherein the interfacial layer comprises a semiconductor oxide; depositing a high-k dielectric layer over the interfacial layer; depositing a blocking layer over the high-k dielectric layer; depositing a metal layer over the blocking layer; performing an annealing process when the metal layer is over the blocking layer; and removing the metal layer. In an embodiment, an intermixing layer is formed between the blocking layer and the high-k dielectric layer by the annealing process. In an embodiment, the method further includes removing the blocking layer; forming a work-function layer after the blocking layer is removed; and forming a metal-containing capping layer over the work-function layer. In an embodiment, the method further includes forming a work-function layer over the blocking layer. In an embodiment, the depositing the metal layer comprises depositing a metal selected from the group consisting of aluminum, titanium, hafnium, zirconium, and combinations thereof. In an embodiment, the annealing process is performed at a temperature in a range between about 400° C. and about 535° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an interfacial layer over a semiconductor region, wherein the interfacial layer comprises a semiconductor oxide;
   depositing a high-k dielectric layer over the interfacial layer;
   depositing a blocking layer over the high-k dielectric layer;
   depositing a metal layer over the blocking layer;
   performing an annealing process when the metal layer is over the blocking layer, wherein an intermixing layer is formed between the blocking layer and the high-k dielectric layer by the annealing process, and wherein the intermixing layer comprises a metal diffused from the metal layer; and
   removing the metal layer.

2. The method of claim 1 further comprising:
   removing the blocking layer to reveal the intermixing layer;
   forming a work-function layer over the intermixing layer; and
   forming a metal-containing capping layer over the work-function layer.

3. The method of claim 1 further comprising forming a work-function layer over the intermixing layer.

4. The method of claim 1, wherein the depositing the metal layer comprises depositing a metal selected from the group consisting of aluminum, titanium, hafnium, zirconium, chromium, tungsten, vanadium, molybdenum, and combinations thereof.

5. The method of claim 1, wherein the annealing process is performed at a temperature in a range between about 400° C. and about 535° C.

6. The method of claim 1, wherein the intermixing layer further comprises oxygen deprived from the interfacial layer.

7. A method comprising:
   forming an oxide layer over a semiconductor region;
   depositing a high-k dielectric layer over the oxide layer;
   depositing a blocking layer over the high-k dielectric layer;
   depositing a metal layer over the blocking layer; and
   performing an annealing process to form an intermixing layer between the high-k dielectric layer and the metal layer, wherein the intermixing layer comprises a metal oxide, with a metal in the metal oxide being diffused from the metal layer, and wherein an additional metal oxide layer is formed between the blocking layer and the metal layer by the annealing process.

8. The method of claim 7 further comprising, after the annealing process, removing the metal layer.

9. The method of claim 7, wherein after the annealing process, the metal layer is substantially un-oxidized.

10. The method of claim 7, wherein the annealing process is performed using a process gas selected from the group consisting of $N_2$, $H_2$, Ar, He, and combinations thereof.

11. The method of claim 7, wherein the depositing the metal layer comprises depositing an aluminum layer.

12. The method of claim 7 further comprising, depositing a work-function layer over the intermixing layer.

13. The method of claim 12 further comprising removing the metal layer before the depositing the work-function layer.

14. The method of claim 7, wherein the annealing process is performed at a temperature in a range between about 400° C. and about 535° C.

15. The method of claim 7, wherein the additional metal oxide layer comprises an additional metal oxide of a metal in the metal layer.

16. A method comprising:
    forming an interfacial layer over a silicon germanium region, wherein the interfacial layer comprises a silicon oxide and a germanium oxide;
    depositing a high-k dielectric layer over the interfacial layer;
    depositing a blocking layer over the high-k dielectric layer;
    depositing a metal layer over the blocking layer; and
    performing an annealing process, wherein in the annealing process, the germanium oxide in the interfacial layer is decomposed as geranium and oxygen, and the silicon oxide in the interfacial layer remains.

17. The method of claim 16, wherein the oxygen generated from decomposed germanium oxide diffuses to an interface region between the blocking layer and the high-k dielectric layer to form an intermixing layer, and wherein the intermixing layer comprises oxygen, a first metal from the blocking layer, a second metal from the metal layer, and a third metal from the high-k dielectric layer.

18. The method of claim 17 further comprising:
    removing the block layer to reveal the intermixing layer; and
    depositing a work-function layer over the intermixing layer.

19. The method of claim 16, wherein the germanium generated from decomposed germanium oxide diffuses into a surface layer of the silicon germanium region.

20. The method of claim 16 further comprising, after the annealing process, removing the metal layer.

* * * * *